(12) United States Patent
Nam et al.

(10) Patent No.: US 9,716,181 B2
(45) Date of Patent: Jul. 25, 2017

(54) SEMICONDUCTOR DEVICE AND METHOD OF FABRICATING THE SAME

(71) Applicant: SAMSUNG ELECTRONICS CO., LTD., Suwon-si, Gyeonggi-do (KR)

(72) Inventors: Phil Ouk Nam, Suwon-si (KR); Yong-Hoon Son, Yongin-si (KR); Kyunghyun Kim, Seoul (KR); Byeongju Kim, Hwaseong-si (KR); Kwangchul Park, Suwon-si (KR); Yeon-Sil Sohn, Yongin-si (KR); Jin-I Lee, Hwaseong-si (KR); JongHeun Lim, Hwaseong-si (KR); Wonbong Jung, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/176,611

(22) Filed: Jun. 8, 2016

(65) Prior Publication Data
US 2017/0025545 A1    Jan. 26, 2017

(30) Foreign Application Priority Data
Jul. 23, 2015   (KR) ........................ 10-2015-0104487

(51) Int. Cl.
| H01L 29/04 | (2006.01) |
| H01L 29/10 | (2006.01) |
| H01L 31/036 | (2006.01) |
| H01L 29/786 | (2006.01) |
| H01L 27/12 | (2006.01) |

(52) U.S. Cl.
CPC .... H01L 29/78672 (2013.01); H01L 27/1207 (2013.01); H01L 29/78642 (2013.01)

(58) Field of Classification Search
USPC .............. 257/57, 68–71, 296–309, 905–908, 257/E27.084–E27.097, E27.075, 314–326, 257/E27.078, E29.3–E29.309, 255–266, 257/E21.179–E21.182, E21.209–E21.21, 257/E21.422, E21.423, E21.679–E21.694; 438/275–278, 133, 138
See application file for complete search history.

(56) References Cited

U.S. PATENT DOCUMENTS

| 5,943,574 A | 8/1999 | Tehrani et al. |
| 6,569,715 B1 | 5/2003 | Forbes |

(Continued)

*Primary Examiner* — Tram H Nguyen
(74) *Attorney, Agent, or Firm* — Lee & Morse P.C.

(57) ABSTRACT

A semiconductor device includes a polycrystalline semiconductor layer on a substrate, first and second stacks on the polycrystalline semiconductor layer, the first and second stacks extending in a first direction, a separation trench between the first and second stacks and extending in the first direction, the separation trench separating the first and second stacks in a second direction crossing the first direction, and vertical channel structures vertically passing through each of the first and second stacks, wherein the polycrystalline semiconductor layer includes a first grain region and a second grain region in contact with each other, the first and second grain region being adjacent to each other along the second direction, and wherein each of the first and second grain regions includes a plurality of crystal grains, each crystal grain having a longitudinal axis parallel to the second direction.

20 Claims, 22 Drawing Sheets

(56) References Cited

U.S. PATENT DOCUMENTS

| | | | |
|---|---|---|---|
| 6,670,638 B2 | 12/2003 | Tamura et al. | |
| 7,528,408 B2 | 5/2009 | Takeda et al. | |
| 7,910,432 B2 | 3/2011 | Tanaka et al. | |
| 8,507,918 B2 | 8/2013 | Son et al. | |
| 8,619,453 B2 | 12/2013 | Scheuerlein | |
| 8,634,242 B2 | 1/2014 | Grossi et al. | |
| 2004/0058076 A1 | 3/2004 | Peng | |
| 2012/0276702 A1* | 11/2012 | Yang | H01L 27/11582 438/270 |
| 2016/0197090 A1* | 7/2016 | Sasaki | H01L 27/11568 438/268 |
| 2016/0307910 A1* | 10/2016 | Son | H01L 27/0688 |
| 2016/0315095 A1* | 10/2016 | Sel | H01L 27/11582 |
| 2016/0329340 A1* | 11/2016 | Hwang | H01L 21/30604 |

\* cited by examiner

SEMICONDUCTOR DEVICE AND METHOD OF FABRICATING THE SAME

CROSS-REFERENCE TO RELATED APPLICATION

Korean Patent Application No. 10-2015-0104487, filed on Jul. 23, 2015, in the Korean Intellectual Property Office, and entitled: "Semiconductor Device and Method of Fabricating the Same," is incorporated by reference herein in its entirety.

BACKGROUND

1. Field

Example embodiments relate to a semiconductor device and a method of fabricating the same, and in particular, to a three-dimensional semiconductor device and a method of fabricating the same.

2. Description of the Related Art

Higher integration of semiconductor devices is required to satisfy consumer demands for superior performance and inexpensive prices. In the case of semiconductor devices, since their integration is an important factor in determining product prices, increased integration is especially required. In the case of typical two-dimensional or planar semiconductor memory devices, since their integration is mainly determined by the area occupied by a unit memory cell, integration is greatly influenced by the level of a fine pattern forming technology. However, extremely expensive process equipment needed to increase pattern fineness sets a practical limitation on increasing integration for two-dimensional or planar semiconductor devices. To overcome such a limitation, there have been recently proposed three-dimensional semiconductor memory devices having three-dimensionally arranged memory cells.

SUMMARY

Example embodiments provide a highly-reliable, highly-integrated large-capacity semiconductor device.

Other example embodiments provide a method of fabricating a highly-reliable, highly-integrated large-capacity semiconductor device.

According to example embodiments, a semiconductor device may include a polycrystalline semiconductor layer on a substrate, first and second stacks on the polycrystalline semiconductor layer, each of the first and second stacks extending in a first direction, a separation trench between the first and second stacks and extending in the first direction, the separation trench separating the first and second stacks in a second direction crossing the first direction, and vertical channel structures vertically passing through each of the first and second stacks, wherein the polycrystalline semiconductor layer includes a first grain region and a second grain region in contact with each other, the first and second grain region being adjacent to each other along the second direction, and wherein each of the first and second grain regions includes a plurality of crystal grains, each crystal grain having a longitudinal axis parallel to the second direction.

In some embodiments, the polycrystalline semiconductor layer may include a grain boundary region including grain boundaries, each of which is defined by adjacent crystal grains respectively included in the first and second grain regions. The grain boundary region may extend in the first direction.

In some embodiments, when viewed in a plan view, the grain boundary region may be overlapped with the separation trench.

In some embodiments, when viewed in a plan view, the grain boundary region may be spaced apart from the vertical channel structures.

In some embodiments, when viewed in a plan view, the grain boundary region may be spaced apart from the first and second stacks.

In some embodiments, the polycrystalline semiconductor layer may further include a common source region extending in the first direction, and when viewed in a plan view, the grain boundary region and the common source region may be overlapped with each other.

In some embodiments, a mean length, in the second direction, of the crystal grains may be longer than two times a mean length, in the first direction, of the crystal grains.

In some embodiments, each of the first and second grain regions may extend in the first direction.

In some embodiments, when measured in the second direction, a width of the first grain region may be substantially equal to that of the second grain region.

In some embodiments, the polycrystalline semiconductor layer may be provided to have a (110) plane in 90% or more of a total area of a top surface thereof.

In some embodiments, each of the vertical channel structures may comprises a lower semiconductor pattern which is in contact with the polycrystalline semiconductor layer and is shaped like a pillar.

In some embodiments, the polycrystalline semiconductor layer may include a top surface defining a recess region, and the lower semiconductor pattern may be provided to fill the recess region.

In some embodiments, the semiconductor device may further include a peripheral circuit structure disposed between the substrate and the polycrystalline semiconductor layer.

According to example embodiments, a semiconductor device may include a polycrystalline semiconductor layer provided on a substrate, a plurality of stacks provided on the polycrystalline semiconductor layer and spaced apart from each other in a second direction by separation trenches, which extend in a first direction crossing the second direction and are spaced apart from each other in the second direction, and vertical channel structures vertically passing through the stacks. The polycrystalline semiconductor layer may include a plurality of grain regions arranged in the second direction, each of the grain regions includes crystal grains formed to have a longitudinal axis parallel to the second direction. The polycrystalline semiconductor may include grain boundary regions, in which grain boundaries are provided, and each the grain boundaries may be defined by adjacent ones of the crystal grains respectively included in an adjacent pair of the grain regions.

In some embodiments, each of the grain boundary regions may extend in the first direction.

In some embodiments, the grain boundary regions may be spaced apart from each other by a specific interval in the second direction.

In some embodiments, when viewed in a plan view, each of the grain boundary regions may be overlapped with the separation trenches.

In some embodiments, the grain boundary regions may be arranged in the second direction.

In some embodiments, when measured in the second direction, an interval between the grain boundary regions may be substantially equal to an integer times an interval between the separation trenches.

In some embodiments, when viewed in a plan view, each of the vertical channel structures may be spaced apart from the grain boundary regions.

According to example embodiments, a semiconductor device may include a polycrystalline semiconductor layer on a substrate, longitudinal axes of crystal grains in the polycrystalline semiconductor layer being oriented along a same direction, first and second stacks on the polycrystalline semiconductor layer, the first and second stacks being spaced apart from each other, a separation trench between the first and second stacks, and vertical channel structures vertically passing through each of the first and second stacks to contact the polycrystalline semiconductor layer.

In some embodiments, the longitudinal axes of the crystal grains in the polycrystalline semiconductor layer may extend in a same direction as an imaginary line connecting the first and second stacks.

In some embodiments, the polycrystalline semiconductor layer may include a first grain region and a second grain region overlapping the first and second stacks, respectively, a contact region between the first and second grain regions defining a grain boundary region exposed through the separation trench.

In some embodiments, each of the vertical channel structures may include a vertical semiconductor pattern in direct contact with the polycrystalline semiconductor layer, the vertical semiconductor pattern being completely separated from the grain boundary region.

In some embodiments, each of the vertical channel structures may include a vertical semiconductor pattern in direct contact with the polycrystalline semiconductor layer, a bottom of the vertical semiconductor pattern directly contacting only a region of the polycrystalline semiconductor layer including regularly arranged crystal grains.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
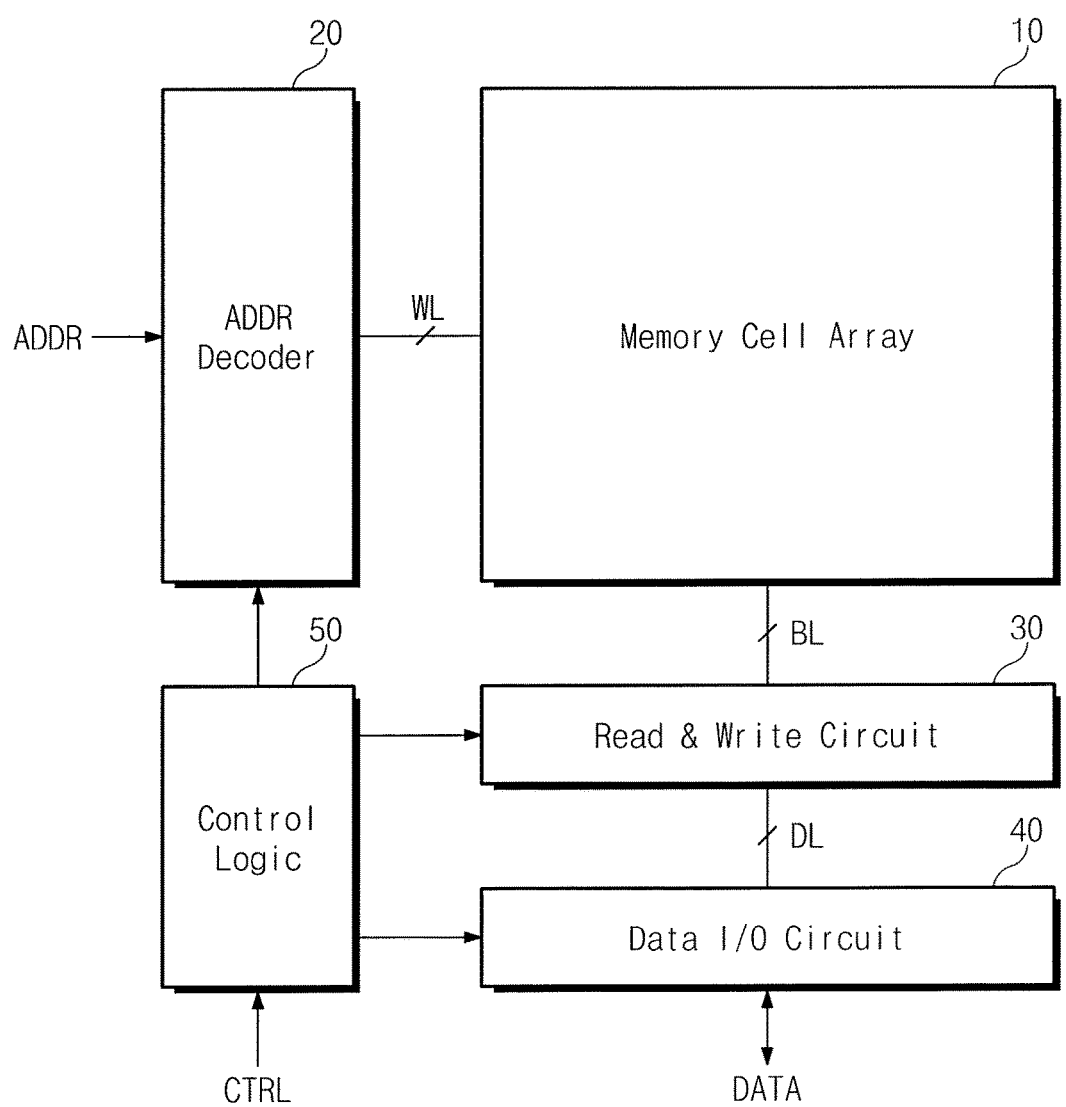
FIG. 1 illustrates a block diagram of a memory device according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers, elements, and regions may be exaggerated for clarity of illustration. It will also be understood that when a layer or element is referred to as being "on," "connected to," or "coupled to" another layer, element, or substrate, it can be directly on, connected to, or coupled to the other layer, element or substrate, or intervening layers or elements may also be present. In addition, it will also be understood that when a layer is referred to as being "between" two layers, it can be the only layer between the two layers, or one or more intervening layers may also be present. Other words used to describe the relationship between elements or layers should be interpreted in a like fashion (e.g., "adjacent" versus "directly adjacent". Like reference numerals refer to like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating a semiconductor memory device according to example embodiments. Referring to FIG. 1, a semiconductor memory device according to embodiments may include a memory cell array 10, an address decoder 20, a read/write circuit 30, a data input/output (I/O) circuit 40, and a control logic 50.

The memory cell array 10 may be connected to the address decoder 20 via a plurality of word lines WL, and may be connected to the read/write circuit 30 via a plurality of bit lines BL. The memory cell array 10 may include a plurality of memory cells. For example, the memory cell array 10 may be configured to store one or more bits in each cell.

The address decoder 20 may be connected to the memory cell array 10 via the word lines WL. The address decoder 20 operates according to the control of the control logic 50. The address decoder 20 may receive an address ADDR from the outside. The address decoder 20 decodes a row address among the received address ADDR to select a corresponding word line from among the word lines WL. Also, the address decoder 20 decodes a column address among the address ADDR and transfers the decoded column address to the read/write circuit 30. For example, the address decoder 20 may include elements such as a row decoder, a column decoder, and address buffer.

The read/write circuit 30 may be connected to the memory cell array 10 via the bit line BL, and be connected to the data input/output circuit 40 via the data lines DL. The read/write circuit 30 may operate according to the control of the control logic 50. The read/write circuit 30 receives the decoded column address from the address decoder 20. The read/write circuit 30 selects a bit line BL using the decoded column address. For example, the read/write circuit 30 receives data from the data input/output circuit 40 and writes the received data in the memory cell array 10. The read/write circuit 30 reads data from the memory cell array 10 and transfers the read data to the data input/output circuit 40. The read/write circuit 30 reads data from a first storage region of the memory cell array 10, and writes the read data in a second storage region of the memory cell array 10. For example, the read/write circuit 30 may perform a copy-back operation.

The read/write circuit 30 may include elements which include a page buffer (or a page register) and a column selection circuit. As another example, the read/write circuit 30 may include elements which include, e.g., a sensing amplifier, a write driver, and a column selection circuit.

The data input/output circuit 40 may be connected to the read/write circuit 30 via the data lines DL. The data input/output circuit 40 operates according to the control of the control logic 50. The data input/output circuit 40 exchanges data DATA with the outside. The data input/output circuit 40 transfers the data DATA to the read/write circuit 30 via the data lines DL. The data input/output circuit 40 outputs the data DATA, which is transferred from the read/write circuit 30 through the data lines DL, to the outside. For example, the data input/output circuit 40 may include an element such as a data buffer.

The control logic 50 may be connected to the address decoder 20, the read/write circuit 30 and the data input/output circuit 40. The control logic 50 controls the operation of a semiconductor device. The control logic 50 may operate in response to a control signal CTRL transferred from the outside.

Figure 2:
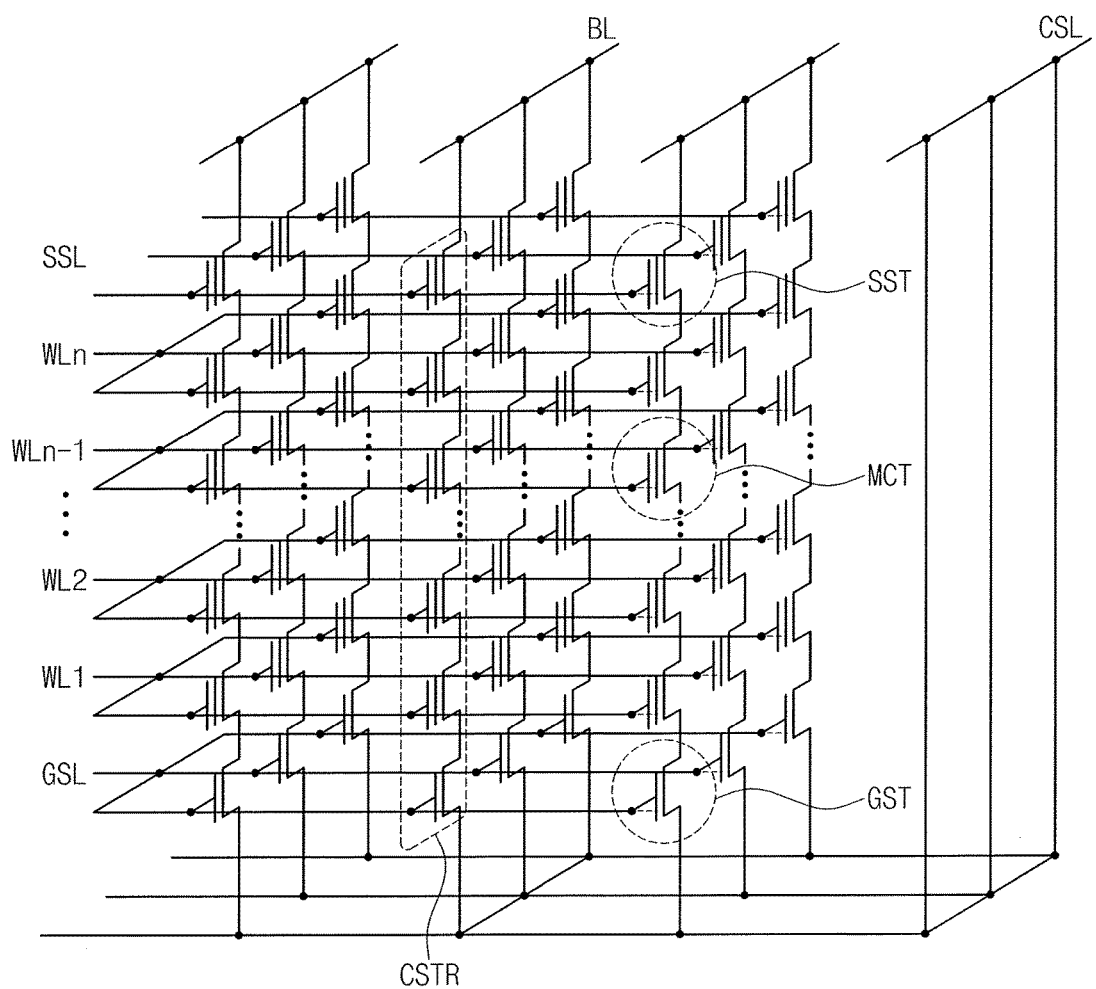
FIG. 2 illustrates a schematic circuit diagram of a cell array of a three-dimensional semiconductor memory device according to example embodiments.

FIG. 2 is a schematic circuit diagram illustrating a cell array of a three-dimensional semiconductor memory device according to example embodiments.

Referring to FIG. 2, a three-dimensional semiconductor memory device according to example embodiments may include a cell array, in which at least one common source line CSL, a plurality of bit lines BL, and a plurality of cell strings CSTR provided therebetween are included.

The common source line CSL may be a conductive layer disposed on a substrate or an impurity region formed in the substrate. The bit lines BL may be conductive patterns (e.g., metal lines) spaced apart from the substrate and disposed over the substrate. The bit lines BL may be two-dimensionally arranged and a plurality of cell strings CSTR may be connected in parallel to each of the bit lines BL. The cell strings CSTR may be connected in common to the common source line CSL. For example, a plurality of the cell strings CSTR may be disposed between the bit lines BL and the common source line CSL. In certain embodiments, a plurality of common source lines CSL may be provided and be two-dimensionally arranged on the substrate. In some embodiments, the common source lines CSL may be applied with the same voltage, but in certain embodiments, the common source lines CSL may be separated from each other and thereby may be independently controlled.

Each of the cell strings CSTR may include a ground selection transistor GST coupled to the common source line CSL, a string selection transistor SST coupled to the bit line BL, and a plurality of memory cell transistors MCT disposed between the ground and string selection transistors GST and SST. Furthermore, the ground selection transistor GST, the string selection transistor SST, and the memory cell transistors MCT may be connected in series.

The common source line CSL may be connected in common to source regions of the ground selection transistors GST. Furthermore, a ground selection line GSL, a plurality of word lines WL0-WLn, and a plurality of string selection lines SSL, which are disposed between the common source line CSL and the bit lines BL, may serve as gate electrodes of the ground selection transistor GST, the memory cell transistors MCT and the string selection transistors SST. In addition, each of the memory cell transistors MCT may include a data storage element.

Figure 3A:
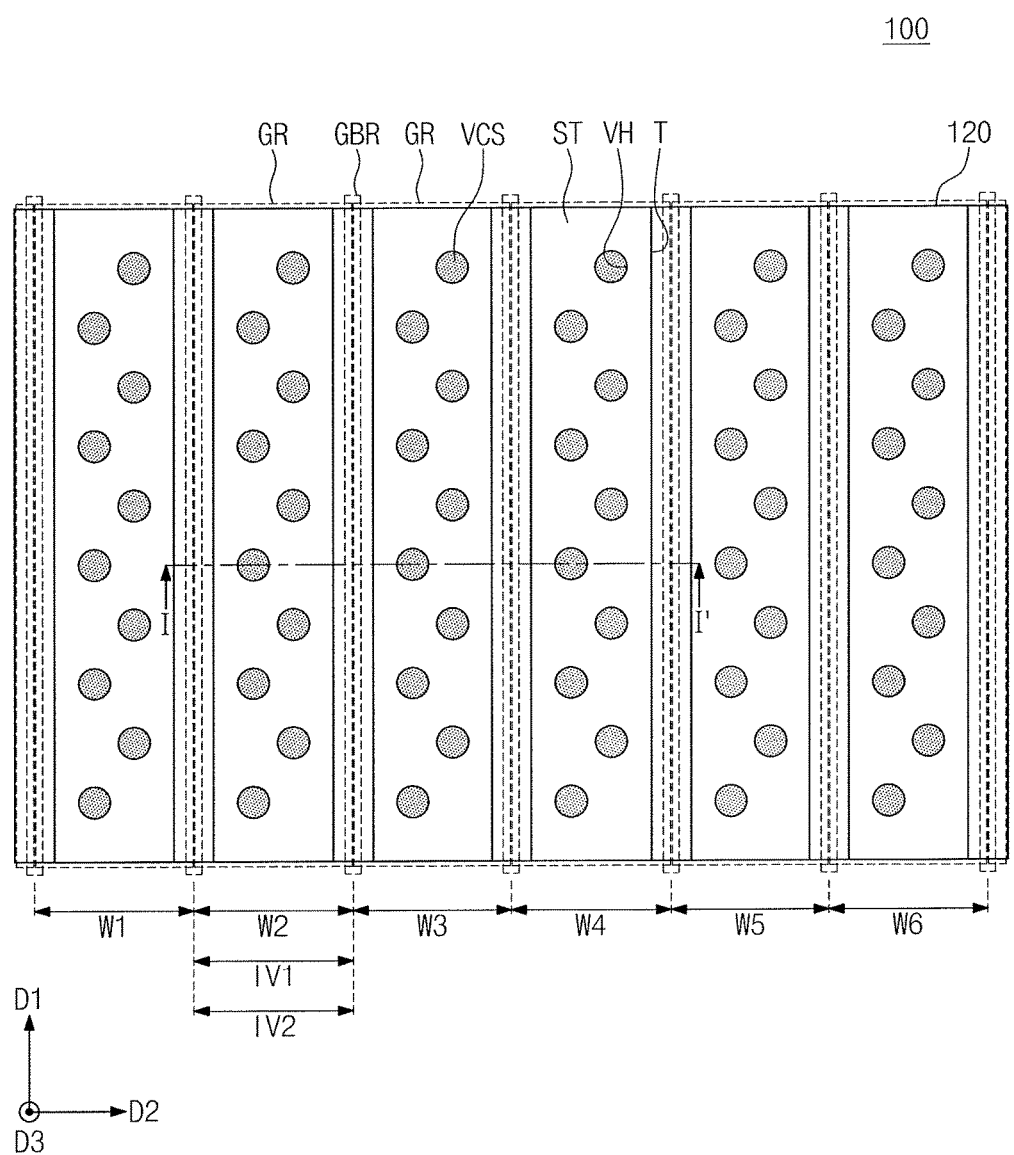
FIG. 3A illustrates a plan view of a semiconductor device according to example embodiments.
Figure 3B:
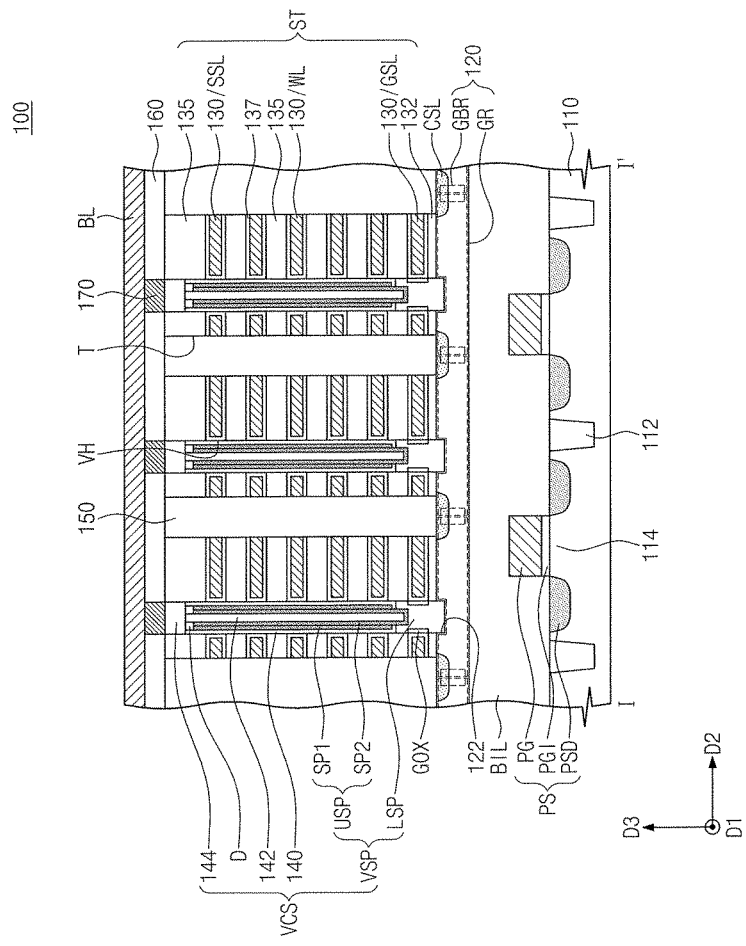
FIG. 3B illustrates a sectional view taken along line I-I' of FIG. 3A.
Figure 3C:
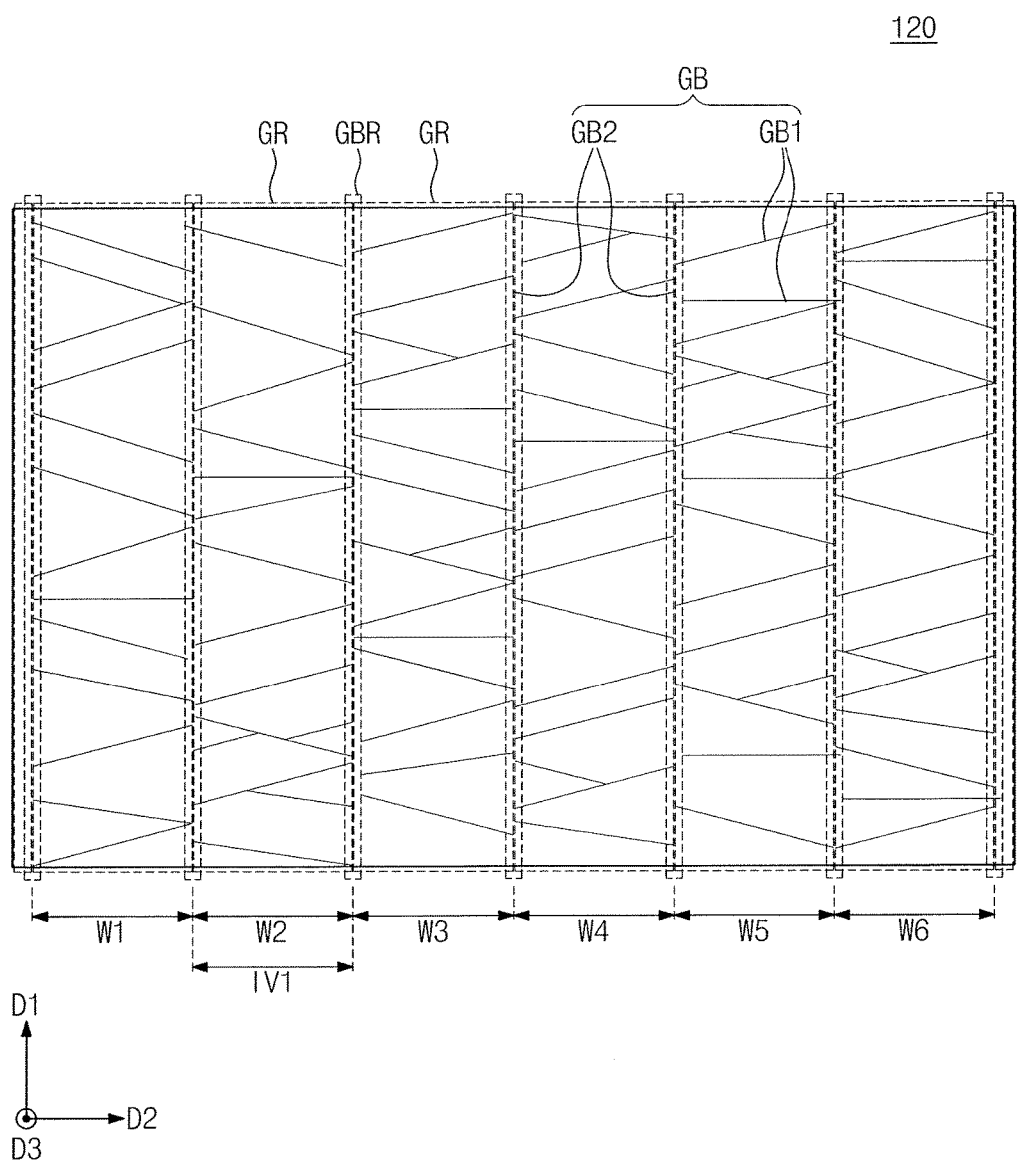
FIG. 3C illustrates a plan view of a polycrystalline semiconductor layer according to example embodiments.

FIG. 3A is a plan view illustrating a semiconductor device according to example embodiments. FIG. 3B is a sectional view taken along line 14' of FIG. 3A. FIG. 3C is a plan view illustrating a polycrystalline semiconductor layer according to example embodiments.

Referring to FIGS. 3A through 3C, a semiconductor device 100 may include a substrate 110, a peripheral circuit structure PS, a polycrystalline semiconductor layer 120, stacks ST, a vertical channel structure VCS, and a bit line BL.

The substrate 110 may be a semiconductor substrate or wafer. For example, the substrate 110 may be formed of or include a single crystalline silicon layer, a silicon layer provided on a silicon germanium (SiGe) layer, a single crystalline silicon layer provided on an insulating layer, or a polycrystalline semiconductor layer provided on an insulating layer. A device isolation layer 112 may be provided in the substrate 110 to define an active region 114.

The peripheral circuit structure PS may include a peripheral gate electrode PG, a peripheral gate insulating layer PGI interposed between the peripheral gate electrode PG and the substrate 110, and peripheral source/drain regions PSD formed at both sides of the peripheral gate electrode PG. The peripheral gate electrode PG may be disposed on the active region 114 of the substrate 110. The peripheral source/drain regions PSD may be provided in the active region 114 at both sides of the peripheral gate electrode PG and may be doped with n- or p-type impurities. The peripheral gate electrode PG and the peripheral source/drain regions PSD may constitute a transistor.

A lower insulating layer BIL may be provided to cover the substrate 110 provided with the peripheral gate structure PS. The lower insulating layer BIL may have a flat top surface. The lower insulating layer BIL may be formed of or include at least one of, e.g., silicon oxide, silicon nitride, or silicon oxynitride.

The polycrystalline semiconductor layer 120 may be provided on the lower insulating layer BIL. The polycrystalline semiconductor layer 120 may include a plurality of grain regions GR.

As shown in FIG. 3C, each of the grain regions GR may include crystal grains having a longitudinal axis substantially crossing (e.g., perpendicular to) a first direction D1 or substantially parallel to a second direction D2, e.g., the longitudinal axis of each of the crystal grains may be a central line extending along a longitudinal direction of the crystal grain. The second direction D2 may cross (e.g., be perpendicular to) the first direction D1. For example, a mean, e.g., average, length in the second direction D2 of the crystal grains may be longer than about two times a mean length in the first direction D1 of the crystal grains. Each of the grain regions GR may extend in the first direction D1. The grain regions GR may be in contact with each other in the second direction D2. As an example, the grain regions GR, which are in contact with each other in the second direction D2, may be arranged along the second direction D2. Each of the grain regions GR may have a uniform width (e.g., one of W1 to W6), when measured in the second direction D2. Accordingly, each of the grain regions GR may have a pair of sides that are substantially parallel to the first direction D1, e.g., each side of a grain region GR may be defined by edges (e.g., second grain boundaries which are described below) of crystal grains therein. In some example embodiments, the widths (e.g., W1 to W6) in the second direction D2 of the grain regions GR may be substantially equal to each other.

The polycrystalline semiconductor layer 120 may include a plurality of grain boundaries GB defined by the plurality of the crystal grains. The plurality of the grain boundaries GB may include first grain boundaries GB1 and second grain boundaries GB2. The first grain boundaries GB1 may be formed between adjacent crystal grains, which are included in each grain region GR, e.g., each first grain boundary GB1 may be between crystal grains adjacent to each other along the first direction D1 within a same grain region GR. The second grain boundaries GB2 may be formed between adjacent crystal grains, which are respectively included in each pair of the grain regions GR in contact with each other, e.g., each second grain boundary GB2 may be between grain regions GR adjacent to each other along the second direction D2.

The polycrystalline semiconductor layer 120 may further include at least one grain boundary region GBR, which is positioned between each pair of the grain regions GR, and in which the second grain boundaries GB2 are provided. In other words, a boundary between an adjacent pair of the grain regions GR may be positioned in the grain boundary region GBR. Since the plurality of the grain regions GR are arranged in the second direction D2 to be in contact with each other, the polycrystalline semiconductor layer 120 may include a plurality of the grain boundary regions GBR arranged in the second direction D2. Each of the grain boundary regions GBR may have a shape elongated in the first direction D1. The grain boundary regions GBR may be arranged spaced apart from each other, by a specific interval IV1, in the second direction D2.

As described above, the polycrystalline semiconductor layer 120 may include a plurality of crystal grains which are arranged in a, e.g., somewhat, regular manner. The polycrystalline semiconductor layer 120 may be formed to have a top surface, in which a specific crystalline structure prevails over the others. As an example, the polycrystalline semiconductor layer 120 may be provided to have a (110) plane in 90% or more of a total area of the top surface thereof.

The stacks ST may be disposed between the polycrystalline semiconductor layer 120 and the bit line BL. Each of the stacks ST may include electrodes 130 and insulating layers 135, which are alternatingly and repeatedly stacked on the polycrystalline semiconductor layer 120. The electrodes 130 may include a ground selection line GSL and a string selection line SSL, which are respectively positioned at the lowermost and uppermost levels thereof, and word lines, which are interposed between the ground and string selection lines GSL and SSL. The electrodes 130 may include at least one of metallic materials (e.g., W, Al, Ti, Ta, Co, or Cu). A buffer dielectric layer 132 may be provided between the ground selection line GSL and the polycrystalline semiconductor layer 120. The buffer dielectric layer 132 may be thinner than each of the insulating layers 135. The buffer dielectric layer 132 and the insulating layers 135 may be formed of or include, e.g., silicon oxide. In some embodiments, each of the stacks ST may further include insulating patterns 137, which are interposed between the vertical channel structure VCS and the electrodes 130, and extend to cover bottom and top surfaces of each of the electrodes 130. The insulating patterns 137 may be formed of or include, e.g., aluminum oxide or hafnium oxide.

The stacks ST may be spaced apart from each other in the second direction D2 by separation trenches T extending in the first direction D1. The stacks ST may be arranged along the second direction D2. When viewed in a plan view, as illustrated in FIG. 3A, each of the stacks ST may extend substantially parallel to the first direction D1. In other words, the separation trenches T may extend substantially parallel to the first direction D1, and may be spaced apart from each other, by a specific interval IV2, in the second direction D2. Accordingly, the stacks ST may be spaced apart from each other, by the separation trenches T interposed therebetween, in the second direction D2. The top surface of the polycrystalline semiconductor layer 120 may be exposed by the separation trenches T, so the grain boundary regions GBR may be exposed through the separation trenches T.

In detail, when viewed in a plan view, each of the grain boundary regions GBR may be overlapped with a corresponding one of the separation trenches T. Accordingly, the grain boundary regions GBR may be exposed by the separation trenches T, respectively. As shown in FIG. 3A, when measured in the second direction D2, the interval IV1 between the grain boundary regions GBR may be substantially equal to the interval IV2 between the separation trenches T. However, example embodiments are not limited thereto, e.g., when measured in the second direction D2, the interval IV1 of the grain boundary regions GBR may be substantially equal to an integer times the interval IV2 of the separation trenches T.

The common source lines CSL may be provided in an upper region of the polycrystalline semiconductor layer 120 exposed by the separation trenches T. Accordingly, when viewed in a plan view, each of the grain boundary regions GBR may be overlapped with a corresponding one of the common source lines CSL. The common source lines CSL may be doped regions, which are formed in the polycrystalline semiconductor layer 120. The common source lines CSL may extend substantially parallel to the first direction D1 and may be arranged along the second direction D2. The stacks ST and the common source lines CSL may be alternatingly and repeatedly arranged in the second direction D2.

Each of the stacks ST may have a plurality of vertical holes VH, which are formed to penetrate the electrodes 130 and expose the polycrystalline semiconductor layer 120. In some embodiments, the vertical holes VH may extend vertically in the top surface of the polycrystalline semiconductor layer 120. For example, each of the vertical holes VH may include a recess region 122 formed in the top surface of the polycrystalline semiconductor layer 120. As shown in FIG. 3A, the vertical holes VH may be arranged to form a zigzag arrangement in the first direction D1, when viewed in a plan view. However, example embodiments are not limited thereto, and the arrangement of the vertical holes VH may be variously changed.

When viewed in a plan view, the grain boundary regions GBR may be spaced apart from the vertical holes VH. In some example embodiments, when viewed in a plan view, the grain boundary regions GBR may also be spaced apart from the stacks ST.

The vertical channel structures VCS may be provided to fill the vertical holes VH, respectively. Accordingly, when viewed in a plan view, the vertical channel structures VCS may be spaced apart from the grain boundary regions GBR. Each of the vertical channel structures VCS may include a vertical semiconductor pattern VSP, a data storing structure 140, an insulating gap-fill layer 142, and a conductive pad 144.

The vertical semiconductor pattern VSP may include a lower semiconductor pattern LSP and an upper semiconductor pattern USP.

The lower semiconductor pattern LSP may be provided in a lower region of the vertical hole VH and may be in contact with the polycrystalline semiconductor layer 120. For example, the lower semiconductor pattern LSP may have a pillar-shaped structure filling the recess region 122, which is formed in the top surface of the polycrystalline semiconductor layer 120, and the lower region of the vertical hole VH. The lower semiconductor pattern LSP may have a top surface that is positioned at a higher level than a top surface of the lowermost one GSL of the electrodes 130, and the lower semiconductor pattern LSP may have a bottom surface that is positioned at a lower level that the topmost level of the polycrystalline semiconductor layer 120. A gate insulating layer GOX may be provided between the lower semiconductor pattern LSP and the lowermost one GSL of the electrodes 130. The gate insulating layer GOX may be formed of or include, e.g., silicon oxide. The lower semiconductor pattern LSP may include a silicon layer, which may be formed by a selective epitaxial growth (SEG) process using the polycrystalline semiconductor layer 120 exposed by the vertical hole VH as a seed layer.

In the selective epitaxial growth process, a growth rate of an epitaxial semiconductor layer may depend on a crystalline structure of a seed layer. For example, when the selective epitaxial growth process is performed on a single crystalline layer with a regular lattice structure, it is possible to form a semiconductor layer with good lattice characteristics (e.g., good uniformity and a low defect density). However, when the selective epitaxial growth process is performed on a polycrystalline layer with an irregular crystal structure, a semiconductor layer may be formed to have poor lattice characteristics (e.g., poor uniformity and a high defect density).

Therefore, according to example embodiments, the polycrystalline semiconductor layer 120 may be formed to include a plurality of crystal grains, which are arranged in a, e.g., somewhat, regular manner, e.g., with longitudinal axes aligned along a same direction. Further, the polycrystalline semiconductor layer 120 may be formed to have a top surface, in which a specific crystalline structure (e.g., (110) plane) prevails over the others. As such, the regularly arranged crystal grains in the polycrystalline semiconductor layer 120 may facilitate formation of the lower semiconductor pattern LSP on the polycrystalline semiconductor layer 120 with good lattice characteristics (e.g., good uniformity and a low defect density).

In addition, according to example embodiments, the polycrystalline semiconductor layer 120 may be formed to include the grain boundary regions GBR, which are arranged in a, e.g., somewhat, regular manner. For example, the grain boundary regions GBR may have a shape elongated in the first direction D1, and be arranged spaced apart from each other in the second direction D2. Further, when viewed in a plan view, the vertical holes VH and the lower semiconductor pattern LSP may be formed to be spaced apart from the grain boundary regions GBR. Therefore, even if the grain boundary regions GBR were to include irregular crystal or lattice structures, formation of the vertical holes VH at regions spaced apart from the grain boundary regions GBR would prevent growth of the lower semiconductor pattern LSP in regions of irregular crystal or lattice structures. Accordingly, in the case of the semiconductor device according to example embodiments, it is possible to form the lower semiconductor pattern LSP with good lattice characteristics (e.g., good uniformity and a low defect density), even when the lower semiconductor pattern LSP is formed on a polycrystalline semiconductor layer.

The upper semiconductor pattern USP may be provided on the lower semiconductor pattern LSP. The upper semiconductor pattern USP may be electrically connected to the polycrystalline semiconductor layer 120 through the lower semiconductor pattern LSP.

The upper semiconductor pattern USP may extend in a third direction D3 perpendicular to the substrate 110. The upper semiconductor pattern USP may include lower and upper end portions, which are respectively connected to the lower semiconductor pattern LSP and the bit line BL. The conductive pad 144 may be provided on the upper end portion of the upper semiconductor pattern USP. The conductive pad 144 may be formed of or include at least one of, e.g., doped poly silicon or metals. A portion of the upper semiconductor pattern USP in contact with the conductive pad 144 may serve as a drain region D. The drain region D may be formed by doping the upper semiconductor pattern USP with impurities. The upper semiconductor pattern USP may be shaped like a hollow pipe or a macaroni. The upper semiconductor pattern USP may have a bottom that is in a closed state. An inner space of the upper semiconductor pattern USP may be filled with the insulating gap-fill layer 142. The upper semiconductor pattern USP may have a bottom surface positioned at a lower level than a top surface of the lower semiconductor pattern LSP. For example, the upper semiconductor pattern USP may include a bottom portion inserted into the lower semiconductor pattern LSP.

For example, the upper semiconductor pattern USP may include a first semiconductor pattern SP1 and a second semiconductor pattern SP2. The first semiconductor pattern SP1 may be provided on an inner side surface of the vertical hole VH, and the second semiconductor pattern SP2 may be provided on an inner side surface of the first semiconductor pattern SP1. The first semiconductor pattern SP1 may be provided to have a pipe or macaroni shape with open top and bottom. The first semiconductor pattern SP1 may not be in contact with the lower semiconductor pattern LSP or be spaced apart from the lower semiconductor pattern LSP. The second semiconductor pattern SP2 may be shaped like a bottom-closed pipe or an elongated cup. An inner empty space of the second semiconductor pattern SP2 may be filled with the insulating gap-fill layer 142. The second semiconductor pattern SP2 may be in contact with the lower semiconductor pattern LSP and may include a portion inserted into the lower semiconductor pattern LSP. The second semiconductor pattern SP2 may connect the first semiconductor pattern SP1 to the lower semiconductor pattern LSP.

The data storing structure 140 may be provided between the upper semiconductor pattern USP and the inner side surface of the vertical hole VH. The data storing structure 140 may be provided between the upper semiconductor pattern USP and at least one of the electrodes 130. The data storing structure 140 may include a blocking insulating layer adjacent to the electrodes 130, a tunnel insulating layer adjacent to the upper semiconductor pattern USP, and a charge storing layer interposed therebetween. The tunnel insulating layer may be formed of or include, e.g., a silicon oxide layer. The charge storing layer may include at least one of, e.g., a silicon nitride layer, a silicon oxynitride layer, a silicon-rich nitride layer, a nano-crystalline silicon layer, or a laminated trap layer. The blocking insulating layer may include a material having an energy band gap greater than that of the charge storing layer. As an example, the blocking insulating layer may be formed of or include at least one of, e.g., a silicon oxide layer, a silicon nitride layer, or a silicon oxynitride layer.

Device isolation patterns 150 may be provided to fill the separation trenches T. The device isolation patterns 150 may be provided to cover the common source lines CSL. The device isolation patterns 150 may be formed of or include at least one of, e.g., silicon oxide, silicon nitride, or silicon oxynitride.

An interlayered insulating layer 160 may be provided to cover the stacks ST and the device isolation patterns 150. The interlayered insulating layer 160 may be formed of or include at least one of, e.g., silicon oxide, silicon nitride, or silicon oxynitride.

The bit line BL may be provided on the interlayered insulating layer 160 to cross the stacks ST. The bit line BL may extend in the second direction D2 and may be formed of or include a metallic material. The bit line BL may be electrically connected to the conductive pads 144 via contact plugs 170 passing through the interlayered insulating layer 160.

FIGS. 4 through 17 are sectional views corresponding to line I-I′ of FIG. 3A and illustrate a method of fabricating a semiconductor device according to example embodiments.

Figure 4:
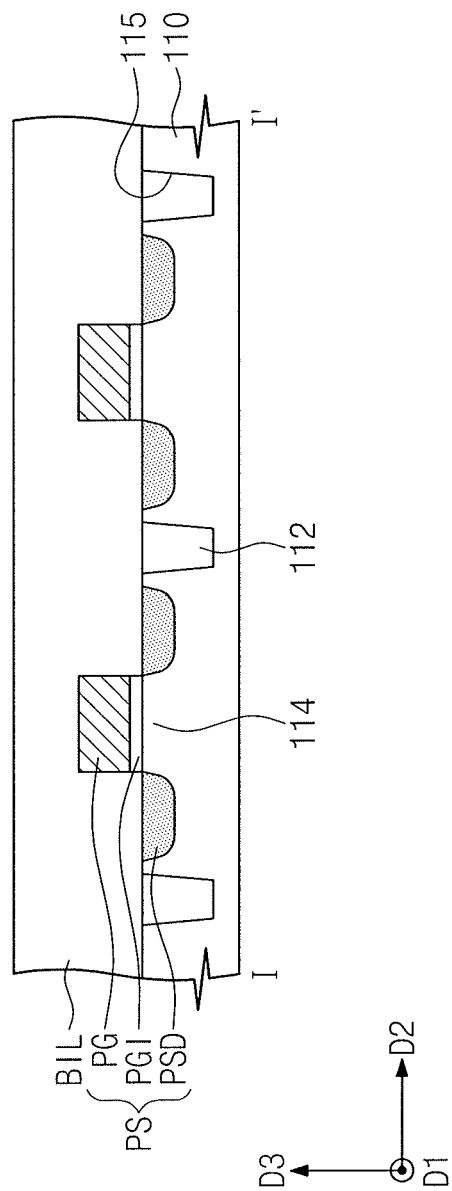
FIGS. 4 through 17 illustrate sectional views corresponding to line I-I' of FIG. 3A, and illustrate stages in a method of fabricating a semiconductor device according to example embodiments.

Referring to FIGS. 3A and 4, the device isolation layer 112 may be formed in the substrate 110 to define the active region 114. The formation of the device isolation layer 112 may include forming a device isolation trench 115 in the top surface of the substrate 110, forming a preliminary device isolation layer in the device isolation trench 115, and planarizing the preliminary device isolation layer to expose the top surface of the substrate 110. The substrate 110 may be a semiconductor substrate or wafer. For example, the substrate 110 may be formed of or include a single crystalline silicon layer, a silicon layer provided on a silicon germanium (SiGe) layer, a single crystalline silicon layer provided on an insulating layer, or a polycrystalline semiconductor layer provided on an insulating layer.

The peripheral circuit structure PS including the peripheral gate insulating layer PGI, the peripheral gate electrode PG, the peripheral source/drain regions PSD may be formed on the active region 114. The formation of the peripheral circuit structure PS may include sequentially forming an insulating layer and a conductive layer on the substrate 110, patterning the insulating layer and the conductive layer to form the peripheral gate insulating layer PGI and the peripheral gate electrode PG on the active region 114, and performing a doping process on the substrate using the peripheral gate electrode PG as a mask to form the peripheral source/drain regions PSD of n- or p-type. The insulating layer may be formed of or include at least one of, e.g., silicon oxide, silicon nitride, or silicon oxynitride. The conductive layer may be formed of or include at least one of, e.g., metal or doped poly silicon.

The lower insulating layer BIL may be formed on the substrate 110 provided with the peripheral circuit structure PS. The formation of the lower insulating layer BIL may include forming an insulating layer to cover the peripheral circuit structure PS and then planarizing the insulating layer.

Figure 5:
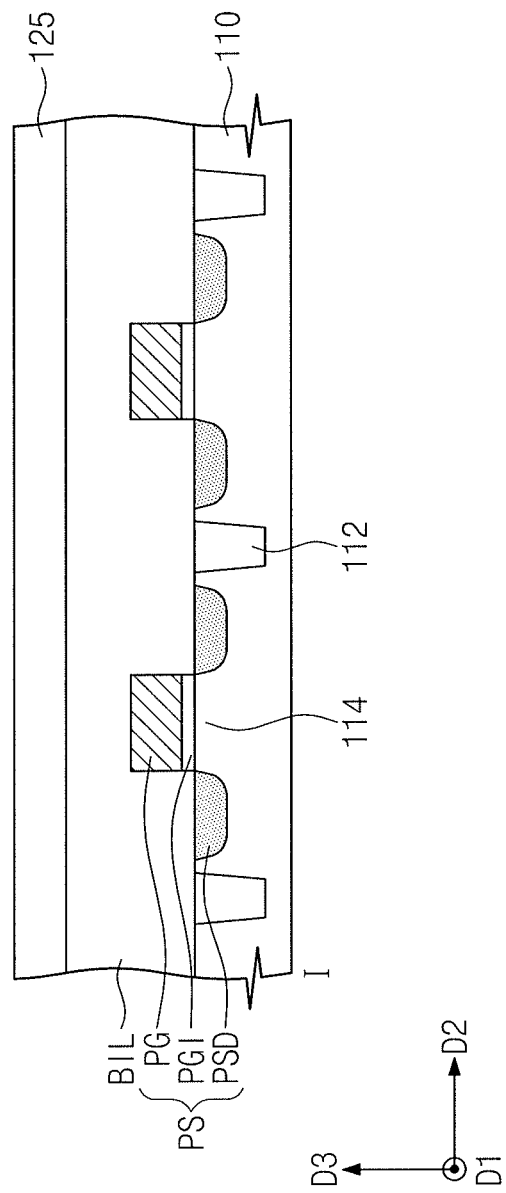

Referring to FIGS. 3A and 5, an amorphous semiconductor layer 125 may be formed on the lower insulating layer BIL. The amorphous semiconductor layer 125 may be formed of or include, e.g., an amorphous silicon layer. The amorphous semiconductor layer 125 may be formed by one of, e.g., a physical vapor deposition (PVD) process, a chemical vapor deposition (CVD) process, or an atomic layer deposition (ALD) process.

Figure 6:
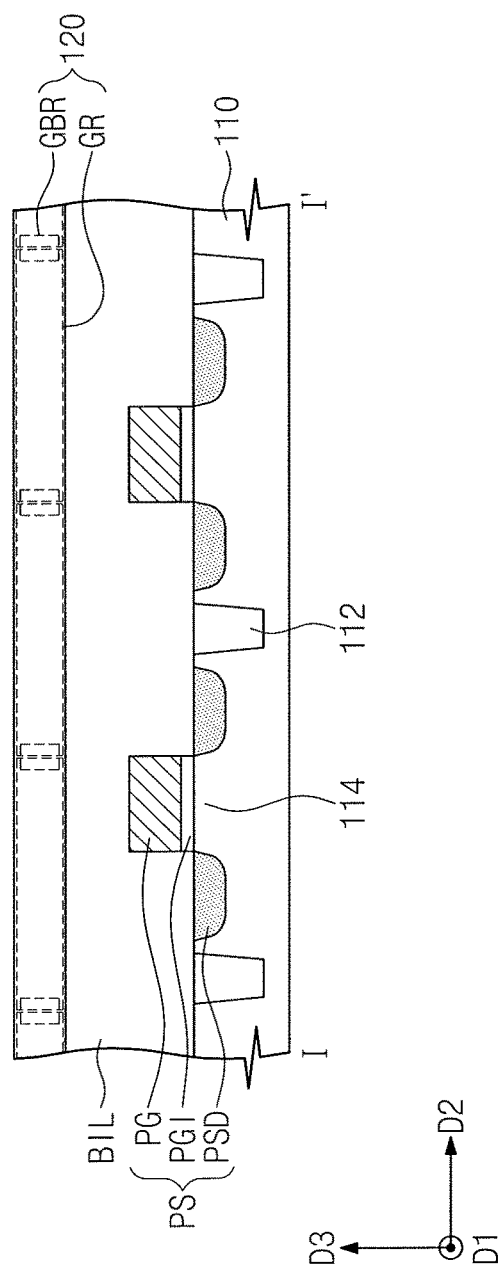

Referring to FIGS. 3A, 3C, and 6, the polycrystalline semiconductor layer 120 may be formed from the amorphous semiconductor layer 125 of FIG. 5. In some embodiments, the polycrystalline semiconductor layer 120 may be formed by performing a laser annealing process on the amorphous semiconductor layer 125.

Figure 18:
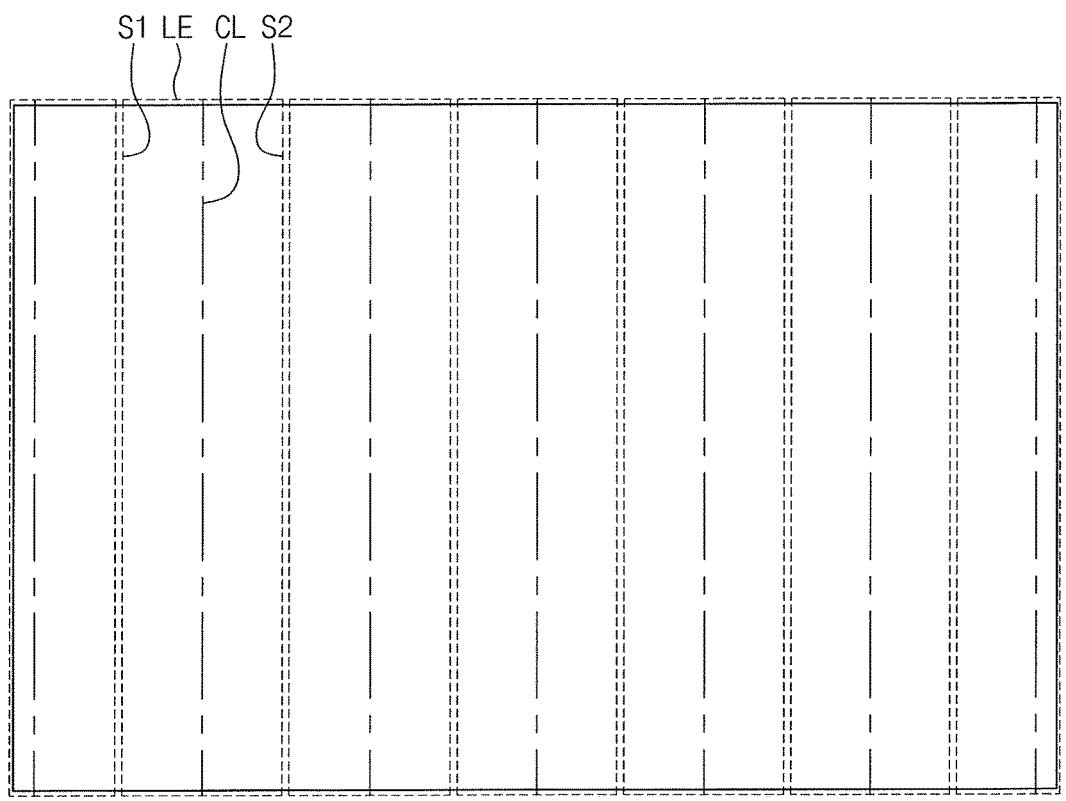
FIG. 18 illustrates a plan view of a method of fabricating a semiconductor device according to example embodiments.

In some embodiments, the laser annealing process may be performed using a sequential lateral solidification (SLS) laser process. FIG. 18 is a plan view illustrating a method of performing the SLS laser process. Referring to FIG. 18, the SLS laser process may include sequentially irradiating respective laser irradiation regions LE, which are defined on the amorphous semiconductor layer 125, with a laser beam. When viewed in a plan view, each of the laser irradiation regions LE may be defined to have a rectangular shape having a longitudinal axis substantially parallel to the first direction D1. Each of the laser irradiation regions LE may have a first side S1 and a second side S2 which extend substantially parallel to the first direction D1 and face each other. Hereinafter, a term 'center line CL' is used to refer to a line that is substantially equidistant from, and substantially parallel to, the first and second sides S1 and S2. When viewed in a plan view, the laser irradiation regions LE may be defined to allow the center lines CL thereof to be located at positions of the grain boundary regions GBR. In certain embodiments, unlike that shown in FIG. 18, the laser irradiation regions LE may be partially overlapped with each other, when viewed in a plan view.

The irradiation of the laser beam on the laser irradiation region LE may be performed to melt a portion of the amorphous semiconductor layer 125 which is overlapped with the laser irradiation region LE in a plan view. Thereafter, the melted portion of the amorphous semiconductor layer 125 may be gradually crystallized in directions from the first and second sides S1 and S2 toward the center line CL, e.g., crystallization may proceed in opposite directions from opposite edges of the laser irradiation region LE (from first and second sides S1 and S2) toward the center line CL thereof. As a result of the crystallization process, crystal grains may be formed to have a longitudinal axis substantially parallel to the second direction D2 crossing (or perpendicular to) the first direction D1. As the crystallization of the crystal grains may occur in opposite directions from the first and second sides S1 and S2, the crystal grains may meet each other near the center line CL to form, e.g., define, the second grain boundaries GB2 near the center line CL. The crystallization process may be sequentially performed on respective laser irradiation regions LE, so the polycrystalline semiconductor layer 120 with the plurality of grain regions GR may be formed as shown in FIG. 3C.

Referring back to FIGS. 3A, 3C, and 6, after sequentially performing the crystallization process (the laser annealing process) on the entire amorphous semiconductor layer 125, the polycrystalline semiconductor layer 120 may include the plurality of grain regions GR. Each of the crystal grains of the grain regions GR may have a shape elongated in the second direction D2. For example, a mean length in the second direction D2 of the crystal grains may be longer than about two times that in the first direction D1. Each of the grain regions GR may extend in the first direction D1. The grain regions GR may be in contact with each other in the second direction D2. As an example, the grain regions GR may be in contact with each other in the second direction D2 and may be arranged along the second direction D2. Each of the grain regions GR may have a uniform width (e.g., one of W1 to W6), when measured in the second direction D2. In some example embodiments, the widths (e.g., W1 to W6) in the second direction D2 of the grain regions GR may be substantially equal to each other.

The polycrystalline semiconductor layer 120 may include the grain boundaries GB defined by the plurality of the crystal grains. The grain boundaries GB may include the first grain boundaries GB1 and the second grain boundaries GB2. The first grain boundaries GB1 may be formed between adjacent crystal grains within a same grain region GR. The second grain boundaries GB2 may be formed between adjacent crystal grains, which are respectively included in each pair of the grain regions GR in contact with each other, i.e., the second grain boundaries GB2 may be formed where the crystal grains meet each other near the center line CL.

The polycrystalline semiconductor layer 120 may further include at least one grain boundary region GBR, which is positioned between each pair of the grain regions GR, and in which the second grain boundaries GB2 are provided. In other words, a boundary between an adjacent pair of the grain regions GR may be positioned in the grain boundary region GBR. Since the plurality of the grain regions GR are arranged in the second direction D2 and are in contact with each other, the polycrystalline semiconductor layer 120 may include a plurality of the grain boundary regions GBR arranged in the second direction D2. Each of the grain boundary regions GBR may have a shape elongated in the first direction D1. The grain boundary regions GBR may be arranged spaced apart from each other, by a specific interval IV1, in the second direction D2.

As described above, the polycrystalline semiconductor layer 120 may include a plurality of crystal grains arranged with somewhat regularity. The polycrystalline semiconductor layer 120 may be formed to have a top surface, in which a specific crystalline structure prevails over the others. As an example, the polycrystalline semiconductor layer 120 may be provided to have a (110) plane in 90% or more of a total area of the top surface thereof.

Figure 7:
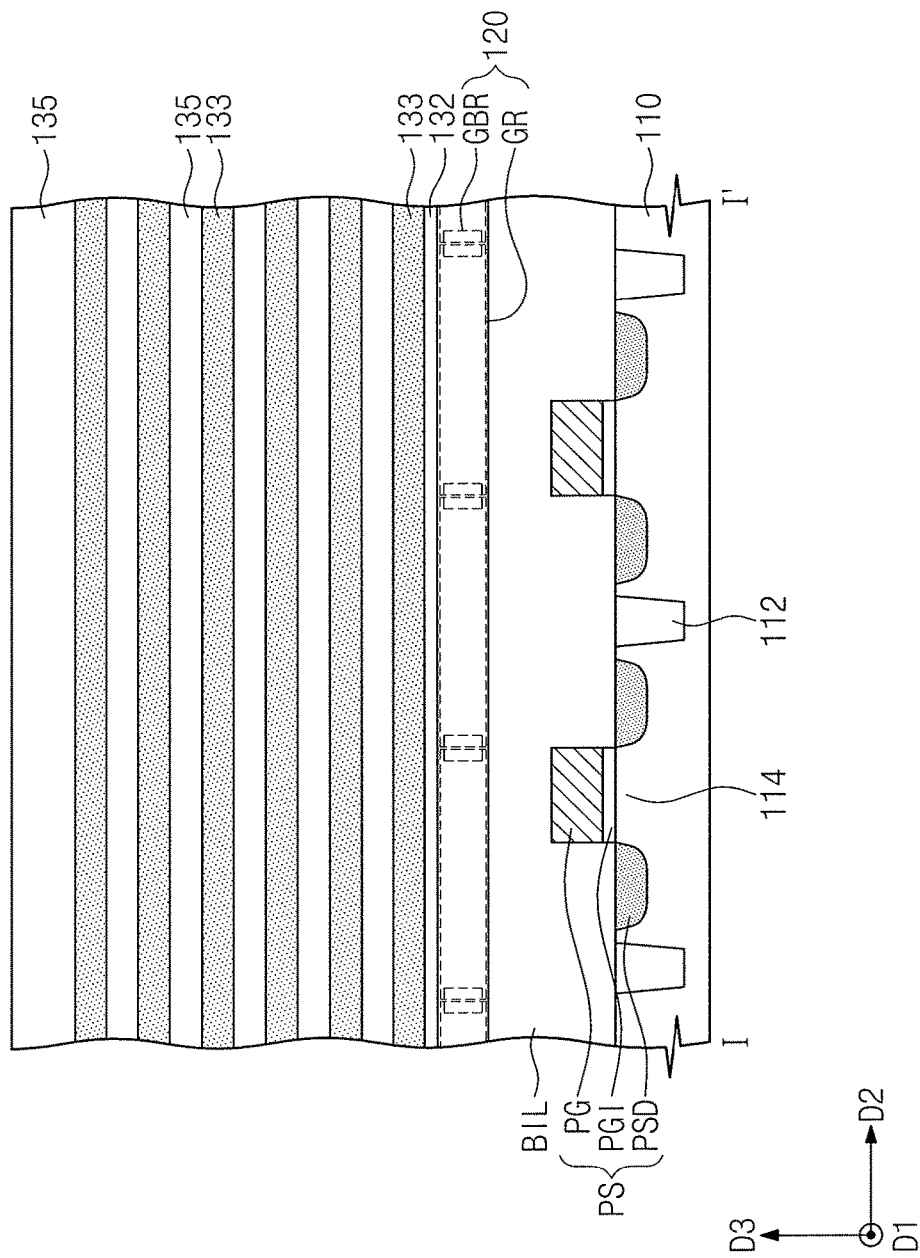

Referring to FIGS. 3A and 7, the buffer dielectric layer 132 may be formed on the polycrystalline semiconductor layer 120. The buffer dielectric layer 132 may be formed of or include, e.g., a silicon oxide layer, which is formed by a thermal oxidation process. The buffer dielectric layer 132 may be formed to be thinner than that of the insulating layers 135 to be described below.

Sacrificial layers 133 and insulating layers 135 may be alternatingly and repeatedly formed on the buffer dielectric layer 132. The uppermost one of the insulating layers 135 may be thicker than the others of the insulating layers 135. The sacrificial layers 133 may be formed of or include at least one of materials, which are selected to have an etch selectivity with respect to the buffer dielectric layer 132 and the insulating layers 135. The insulating layers 135 may be formed of or include, e.g., silicon oxide. The sacrificial layers 133 may be formed of or include at least of, e.g., silicon nitride, silicon oxynitride, poly silicon, or poly silicon germanium. The sacrificial layers 133 and the insulating layers 135 may be formed by, e.g., a CVD process.

Figure 8:
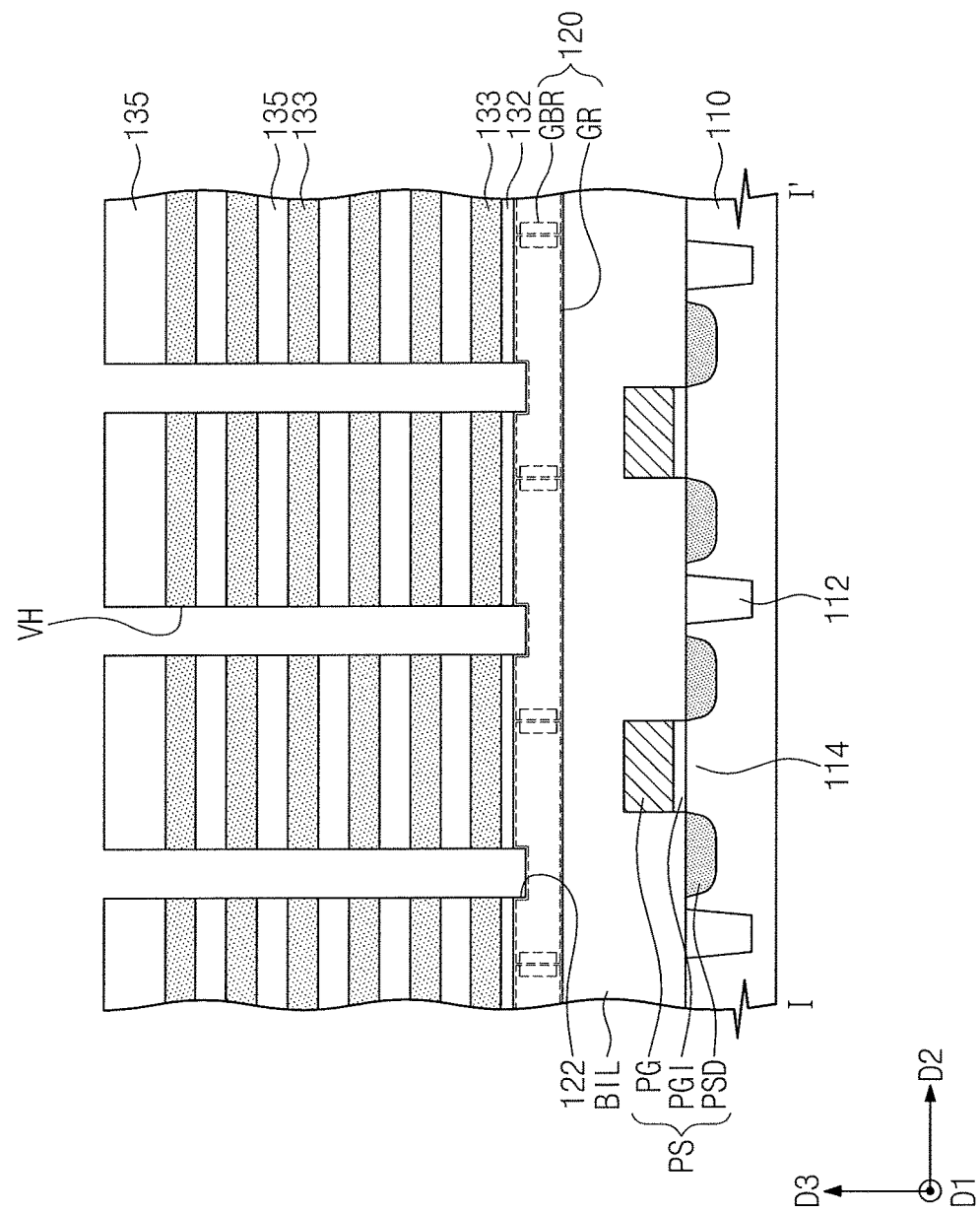

Referring to FIGS. 3A and 8, the vertical holes VH may be formed to penetrate the sacrificial layers 133 and the insulating layers 135 and expose the polycrystalline semiconductor layer 120. The vertical holes VH may be formed by an anisotropic etching process. The anisotropic etching process may be performed in such a way that the top surface of the polycrystalline semiconductor layer 120 is etched to form the recess region 122. When viewed in a plan view, each of the grain boundary regions GBR may be spaced apart from the vertical holes VH.

Figure 9:
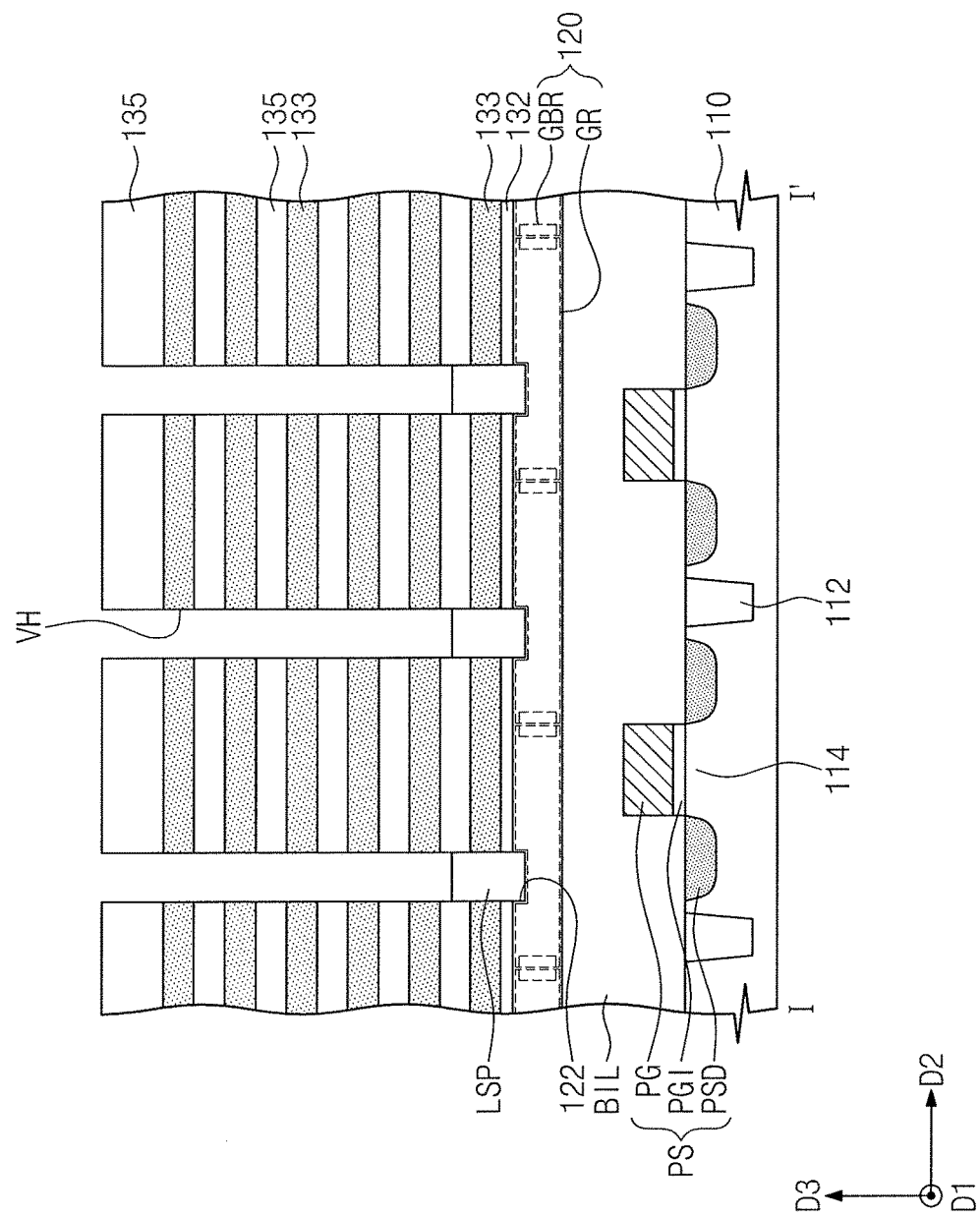

Referring to FIGS. 3A and 9, the lower semiconductor pattern LSP may be formed to fill a lower region of each of the vertical holes VH. The formation of the lower semiconductor pattern LSP may include performing a SEG process, in which the polycrystalline semiconductor layer 120 exposed by the vertical hole VH is used as a seed layer. The lower semiconductor pattern LSP may be formed to fill the recess region 122 and include a portion protruding from the top surface of the polycrystalline semiconductor layer 120. The top surface of the lower semiconductor pattern LSP may be positioned between adjacent opposite surfaces of the lowermost and next lowermost ones of the sacrificial layers 133. The lower semiconductor pattern LSP may be formed of or include, e.g., silicon or silicon germanium.

In the selective epitaxial growth process, a growth rate of an epitaxial semiconductor layer may depend on a crystalline structure of a seed layer. Accordingly, when the selective epitaxial growth process is performed on a single crystalline layer with a regular lattice structure, it is possible to form a semiconductor layer (e.g., the lower semiconductor pattern LSP) with good lattice characteristics (e.g., good uniformity and a low defect density). However, when the selective epitaxial growth process is performed on a polycrystalline layer with an irregular crystal structure, a resultant semiconductor layer may be formed to have poor lattice characteristics (e.g., poor uniformity and a high defect density).

Therefore, according to example embodiments, the polycrystalline semiconductor layer 120 may be formed to include a plurality of crystal grains, which are arranged in a substantially regular manner, and the polycrystalline semiconductor layer 120 may be formed to have a top surface, in which a specific crystalline structure (e.g., (110) plane) prevails over the others. In addition, when viewed in a plan view, the vertical holes VH and the lower semiconductor pattern LSP may be formed to be spaced apart from the grain boundary regions GBR with irregular crystal or lattice structures. Accordingly, in the case of the semiconductor device according to example embodiments, it is possible to form the lower semiconductor pattern LSP on the polycrystalline semiconductor layer 120 with good lattice characteristics (e.g., good uniformity and a low defect density), despite the polycrystalline structure of the semiconductor layer 120.

Figure 10:
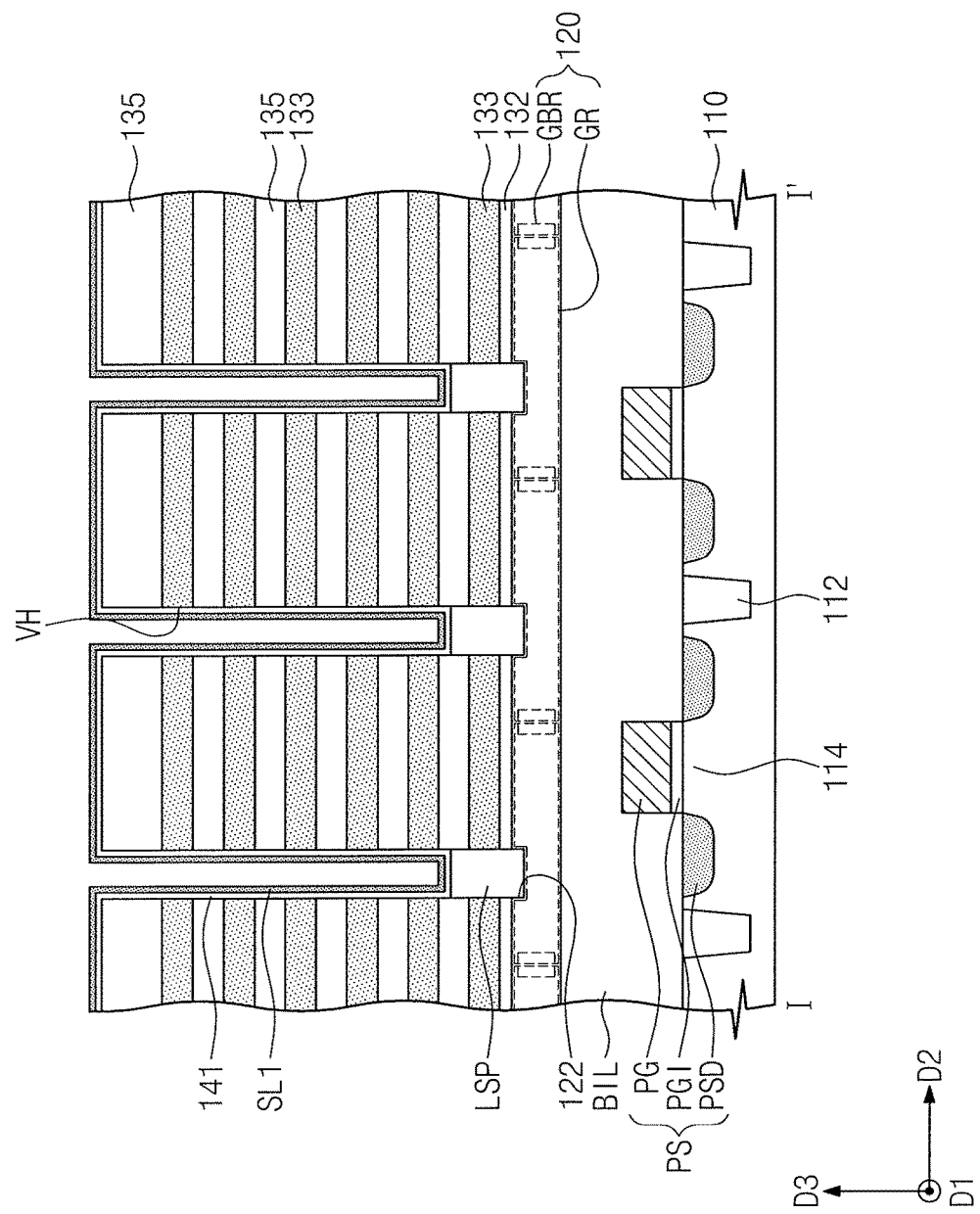

Referring to FIGS. 3A and 10, a memory layer 141 and a first semiconductor layer SL1 may be sequentially formed on inner side surfaces of the vertical holes VH. The memory layer 141 and the first semiconductor layer SL1 may be formed to cover the top surface of the lower semiconductor pattern LSP and may extend to cover the top surface of the uppermost one of the insulating layers 135. In other words, the memory layer 141 and the first semiconductor layer SL1 may be formed to conformally cover the vertical holes VH.

The formation of the memory layer 141 may include sequentially forming a blocking insulating layer, a charge storing layer, and a tunnel insulating layer. The blocking insulating layer may include a material having an energy band gap greater than that of the charge storing layer. As an example, the blocking insulating layer may be formed of or include at least one of a silicon oxide layer, a silicon nitride layer, or a silicon oxynitride layer. The charge storing layer may include at least one of, e.g., a silicon nitride layer, a silicon oxynitride layer, a silicon-rich nitride layer, a nanocrystalline silicon layer, or a laminated trap layer. The tunnel insulating layer may be formed of or include, e.g., a silicon oxide layer. In certain embodiments, each of the blocking insulating layer, the charge storing layer, and the tunnel insulating layer may be formed by an atomic layer deposition (ALD) process.

The first semiconductor layer SL1 may be formed to conformally cover the memory layer 141. The first semiconductor layer SL1 may be formed in the vertical holes VH to cover the memory layer 141 and the top surface of the lower semiconductor pattern LSP and moreover, it may extend to cover the top surface of the uppermost one of the insulating layers 135. The formation of the first semiconductor layer SL1 may include performing a chemical vapor deposition (CVD) process or an atomic layer deposition (ALD) process.

Figure 11:
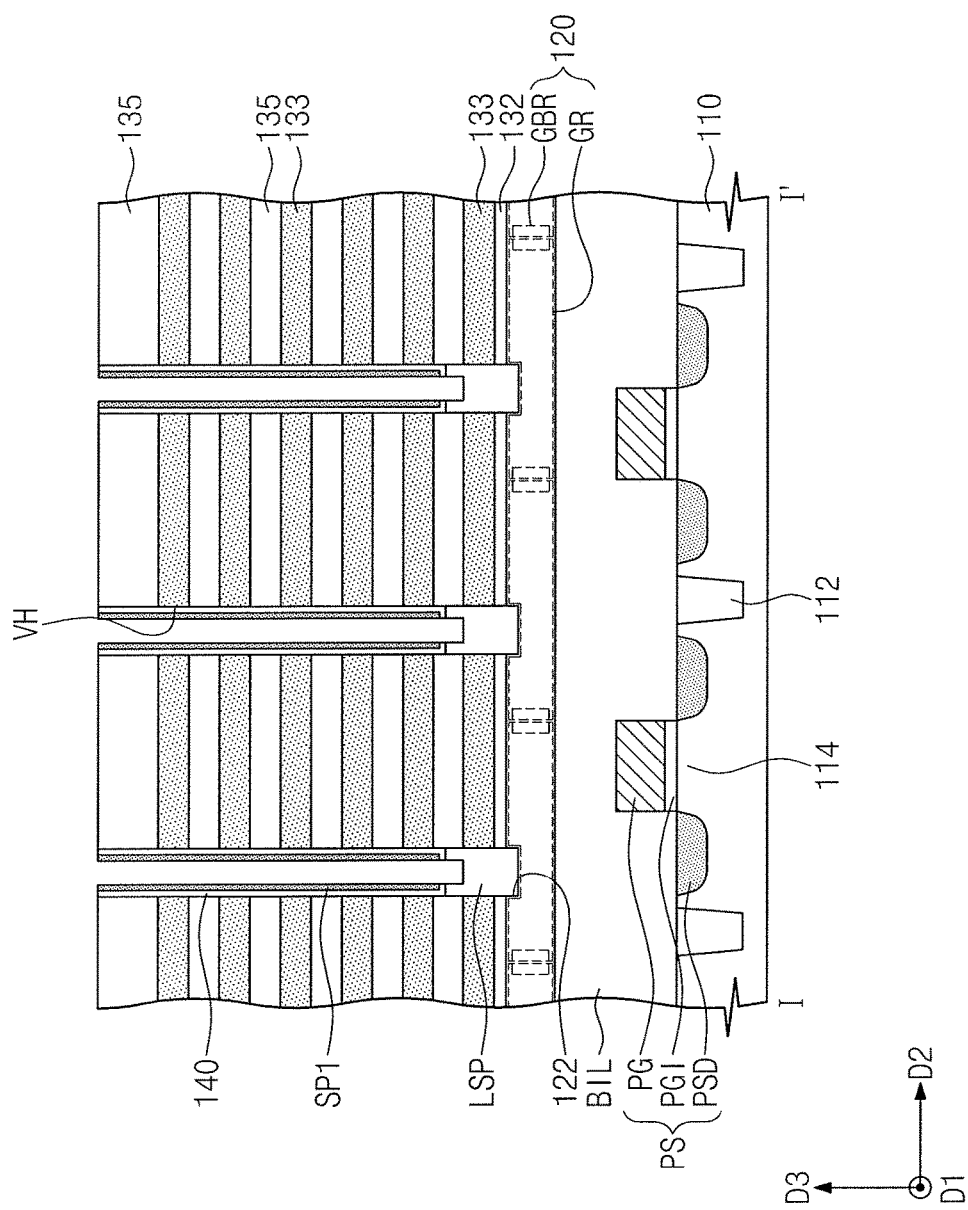

Referring to FIGS. 3A and 11, the memory layer 141 and the first semiconductor layer SL1 may be patterned to form the data storing structure 140 and the first semiconductor pattern SP1. The formation of the data storing structure 140 and the first semiconductor pattern SP1 may include performing an anisotropic etching process on the memory layer 141 and the first semiconductor layer SL1. The anisotropic etching process may be performed to expose the top surface of the uppermost one of the insulating layers 135. In addition, the anisotropic etching process may be performed to expose the lower semiconductor pattern LSP in the vertical hole VH and moreover to partially recess an upper portion of the lower semiconductor pattern LSP.

Figure 12:
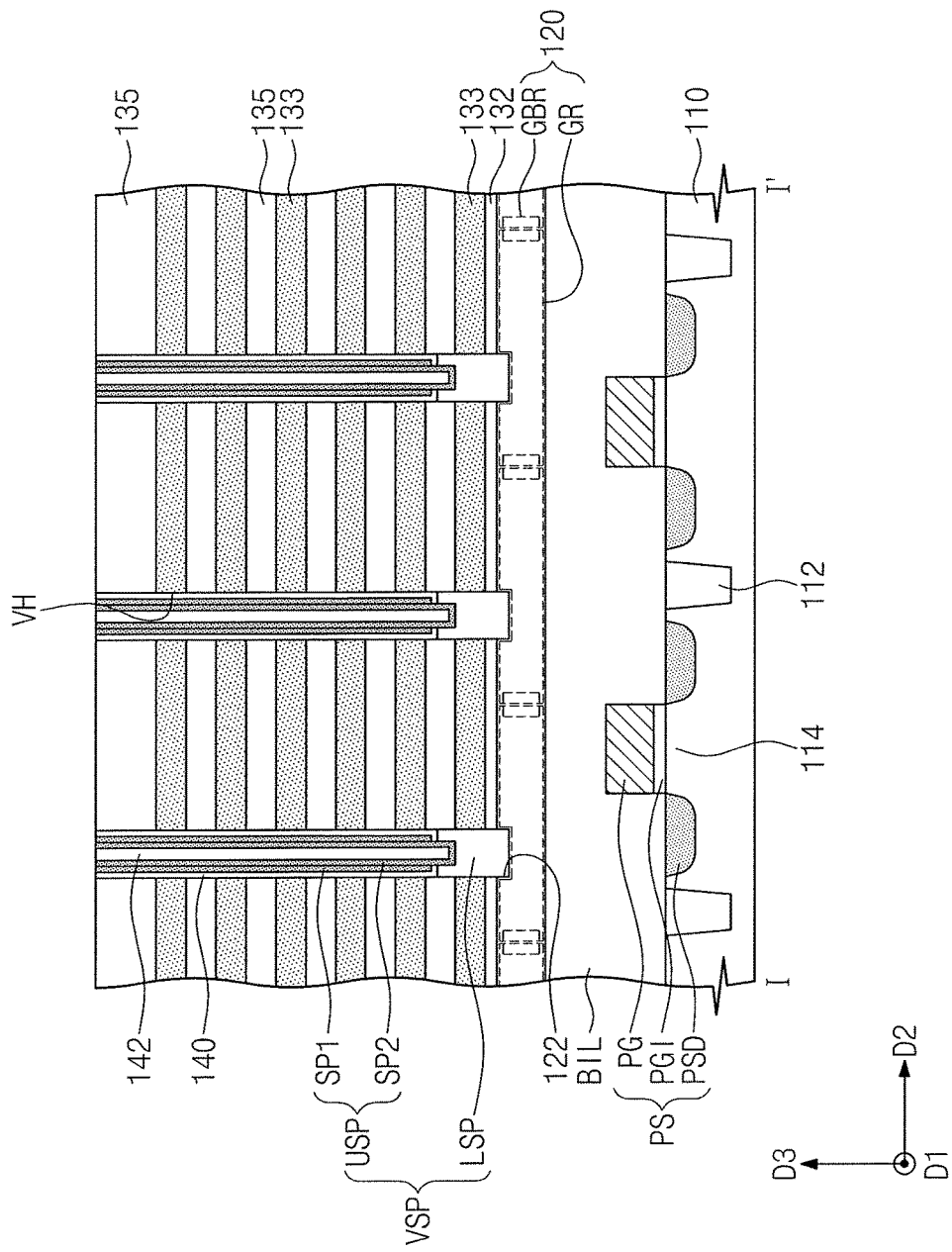

Referring to FIGS. 3A and 12, the second semiconductor pattern SP2 and the insulating gap-fill layer 142 may be formed. The formation of the second semiconductor pattern SP2 may include forming a second semiconductor layer to conformally cover the structure described with reference to FIGS. 3A and 11 and planarizing the second semiconductor layer. The formation of the second semiconductor layer may include performing a chemical vapor deposition (CVD) process or an atomic layer deposition (ALD) process. The formation of the insulating gap-fill layer 142 may include forming an insulating gapfill layer to fill the vertical holes VH and performing a planarization process on the insulating gapfill layer. In certain embodiments, the planarization of the second semiconductor layer and the insulating gapfill layer may be performed concurrently using the same process. The first and second semiconductor patterns SP1 and SP2 may serve as the upper semiconductor pattern USP, and the upper and lower semiconductor patterns USP and LSP may serve as the vertical semiconductor pattern VSP.

Figure 13:
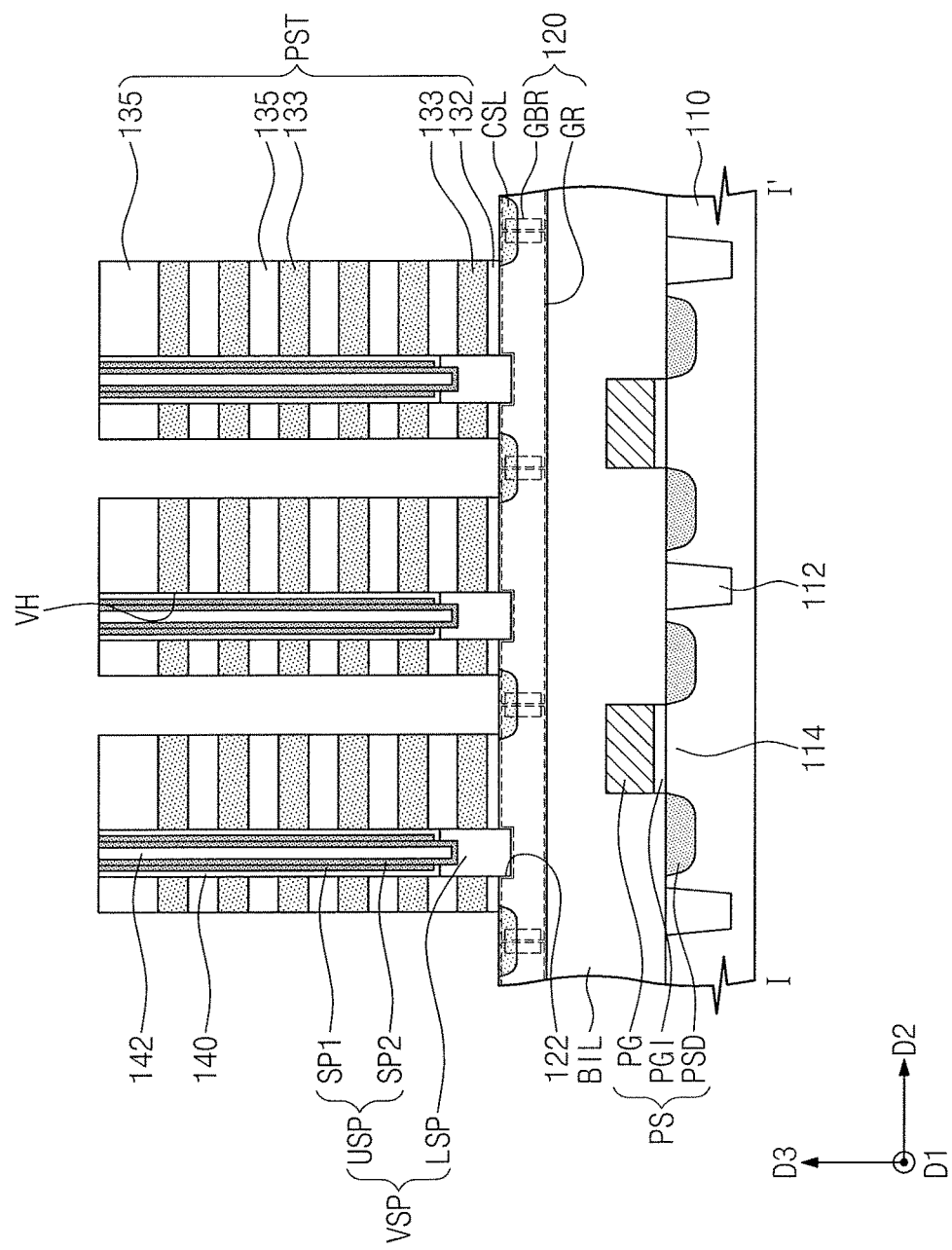

Referring to FIGS. 3A and 13, the separation trenches T may be formed to define preliminary stacks PST.

The formation of the separation trenches T may include sequentially or successively patterning the insulating layers 135, the sacrificial layers 133, and the buffer dielectric layer 132. Each of the separation trenches T may be formed to extend in the first direction D1. Also, the separation trenches T may be formed spaced apart from each other, by a specific interval IV2, in the second direction D2. The separation trenches T may be formed to expose the top surface of the polycrystalline semiconductor layer 120 and moreover to expose the grain boundary regions GBR. When viewed in a plan view, the grain boundary regions GBR may be overlapped with the separation trenches T, respectively. Accordingly, the grain boundary regions GBR may be exposed by the separation trenches T, respectively. As shown in FIG. 3A, when measured in the second direction D2, the interval IV1 between the grain boundary regions GBR may be substantially equal to the interval IV2 between the separation trenches T. However, example embodiments may not be limited thereto, and, e.g., when measured in the second direction D2, the interval IV1 of the grain boundary regions GBR may be substantially equal to an integer times the interval IV2 of the separation trenches T.

The preliminary stacks PST may be spaced apart from each other in the second direction D2 by the separation trenches T. When viewed in a plan view, the preliminary stacks PST may be formed to have a shape extending substantially parallel to the first direction D1.

The common source lines CSL may be formed in an upper region of the polycrystalline semiconductor layer 120 exposed by the separation trenches T. The formation of the common source lines CSL may include doping the polycrystalline semiconductor layer 120 exposed by the separation trenches T with impurities. When viewed in a plan view, each of the grain boundary regions GBR may be overlapped with a corresponding one of the common source lines CSL.

Figure 14:
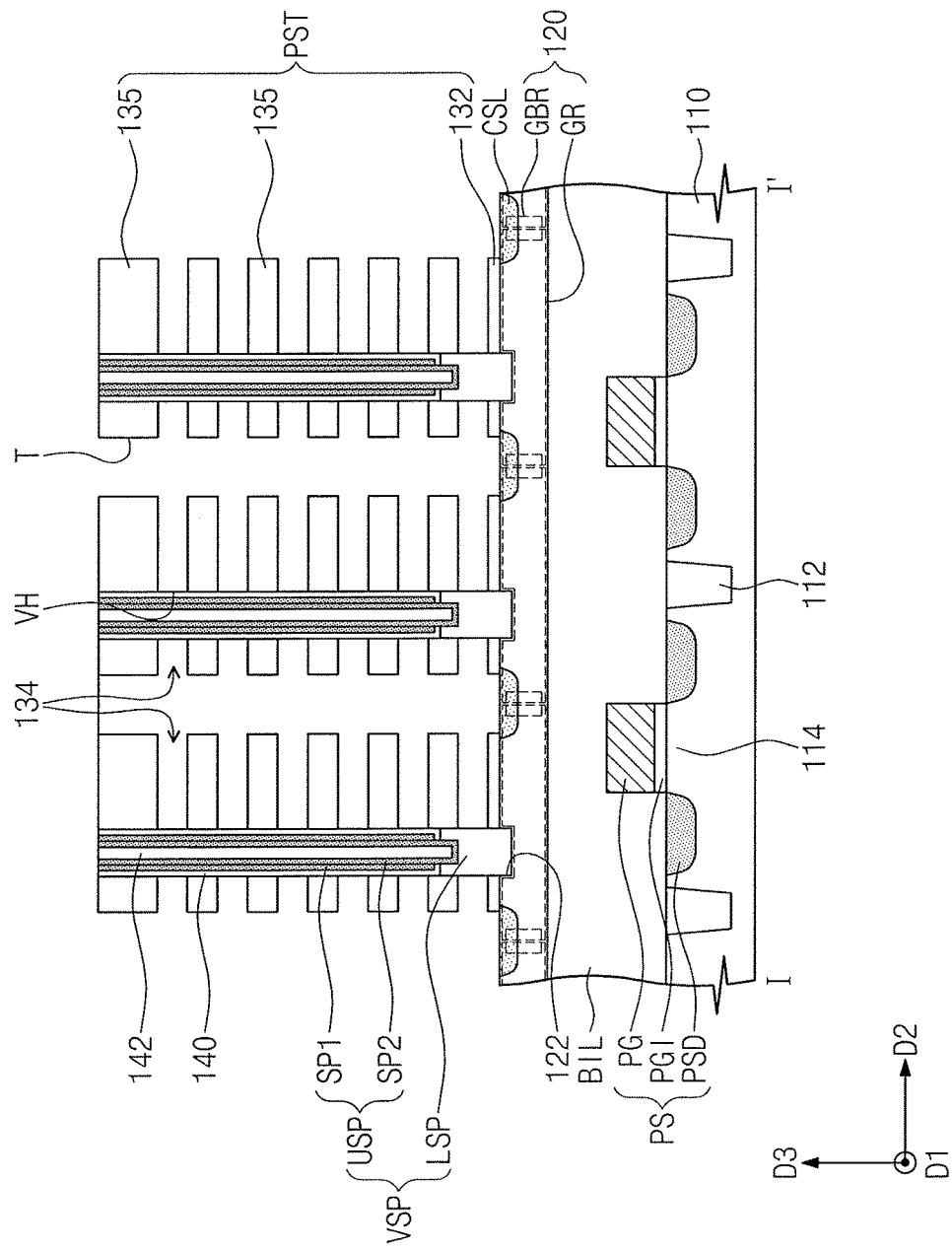

Referring to FIGS. 3A and 14, the sacrificial layers 133 exposed by the separation trenches T may be selectively removed to form gate regions 134. For example, as a result of the removal of the sacrificial layers 133, the gate regions 134 may be formed between the data storing structure 140 and the insulating layers 135. In the case where the sacrificial layers 133 includes a silicon nitride layer or a silicon oxynitride layer, the removal of the sacrificial layers 133 may be performed using an etching solution containing phosphoric acid. In certain embodiments, the gate region 134 may be formed to expose a portion of the data storing structure 140 and/or a portion of the lower semiconductor pattern LSP.

Figure 15:
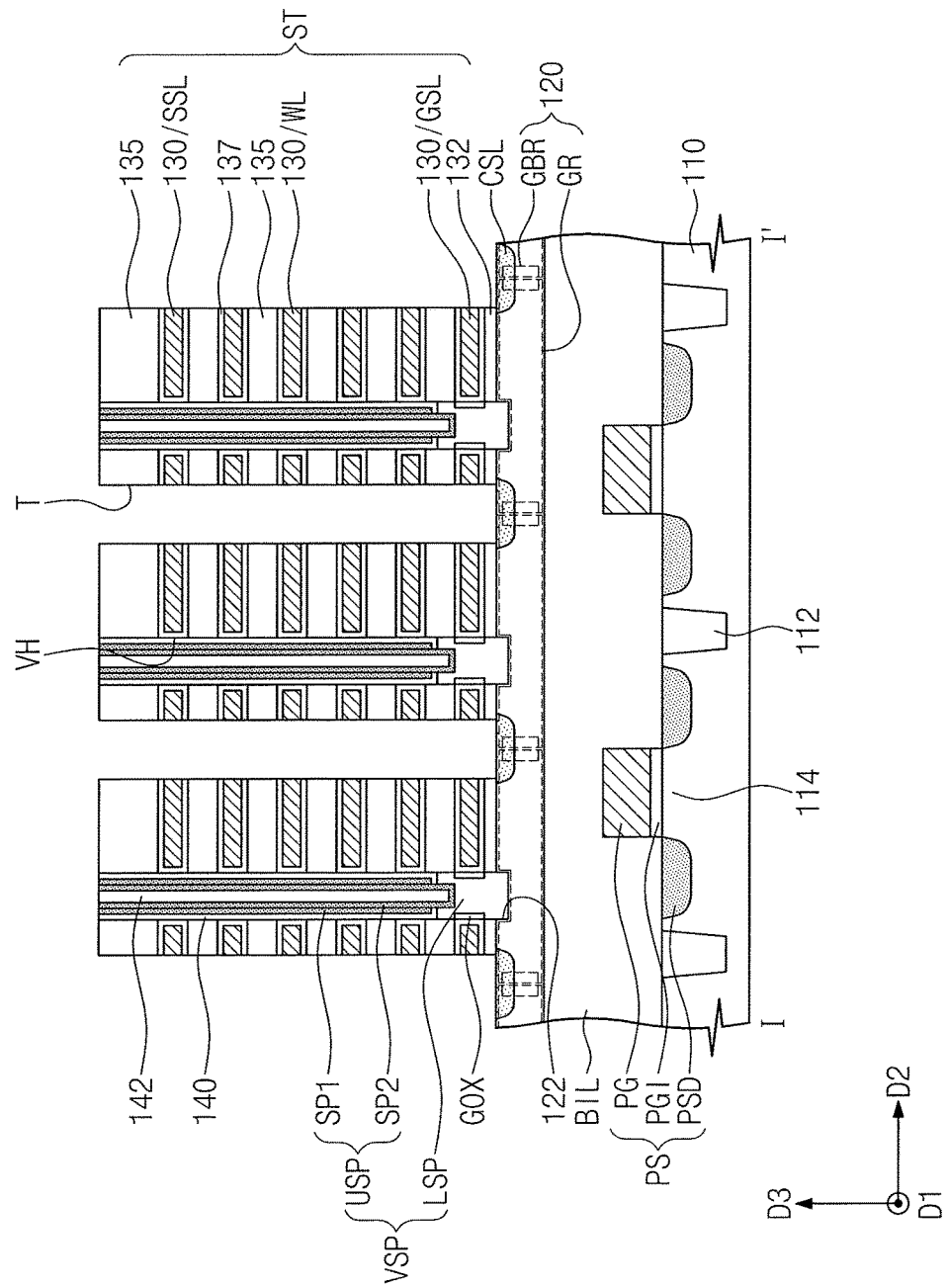

Referring to FIGS. 3A and 15, a thermal oxidation process may be performed on the lower semiconductor pattern LSP exposed by the gate region 134 to form the gate insulating layer or a gate oxide layer GOX.

The insulating patterns 137 may be formed on the insulating layers 135 and the data storing structure 140 exposed by the gate regions 134. For example, forming the insulating patterns 137 may include performing an atomic layer deposition (ALD) process. The insulating patterns 137 may be formed of or include at least one of silicon oxide or high-k dielectric materials (e.g., aluminum oxide or hafnium oxide).

A conductive layer may be formed in the gate region 134. The formation of the conductive layer may include supplying a conductive material into the gate region 134 through the separation trenches T and may be performed by an atomic layer deposition (ALD) process. The conductive layer may be formed of or include at least one of doped poly silicon, metals (e.g., tungsten), or metal nitrides.

Next, the conductive layer may be removed from the outside of the gate region 134 (i.e., from the separation trenches T). Accordingly, the electrodes 130 may be locally formed in the gate regions 134, respectively. Since the conductive layer is removed from the separation trenches T, the polycrystalline semiconductor layer 120 may be exposed through the separation trenches T. Each of the stacks ST may include the electrodes 130, the buffer dielectric layer 132, the insulating layers 135, and the insulating patterns 137.

Figure 16:
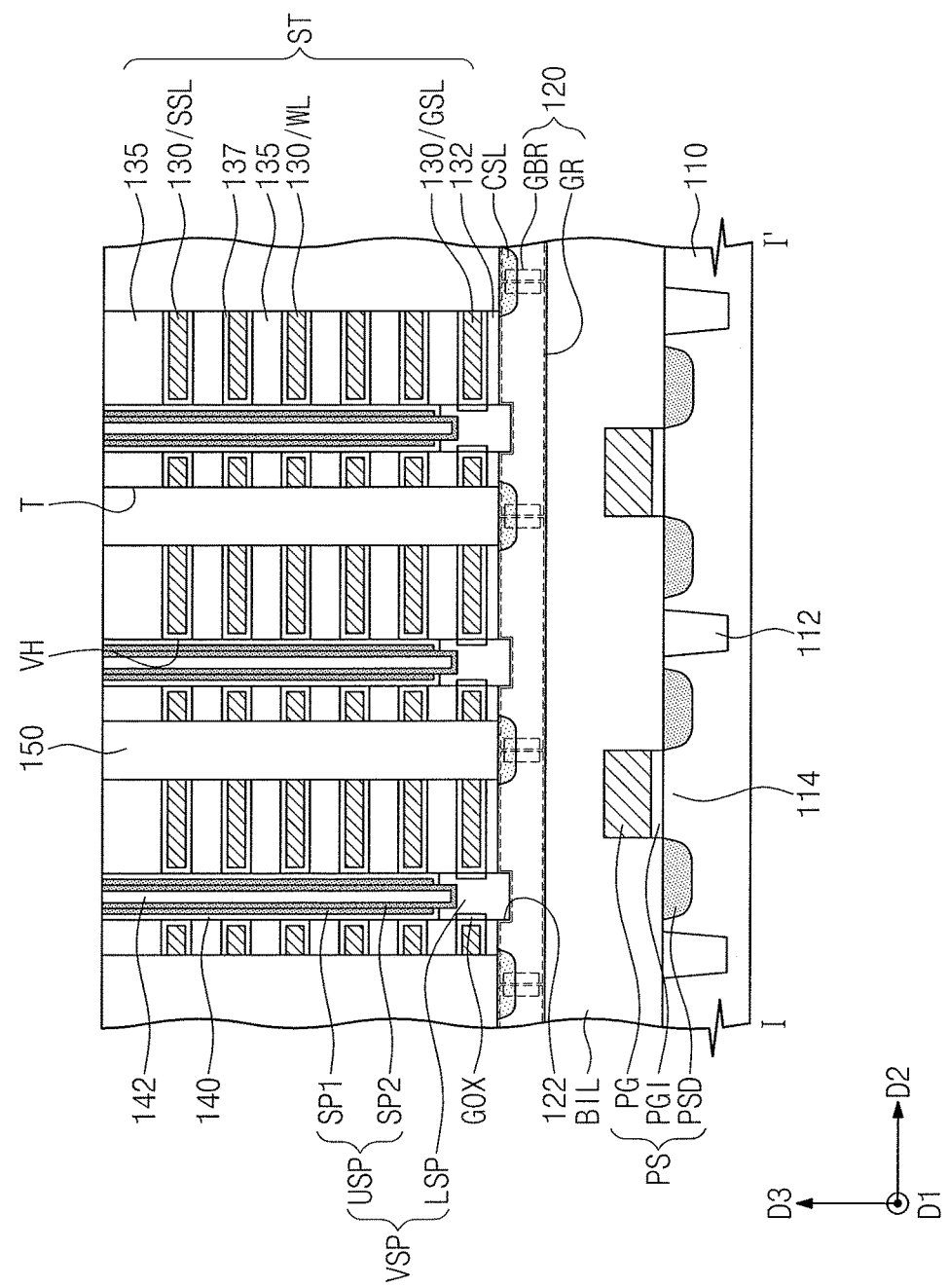

Referring to FIGS. 3A and 16, the device isolation patterns 150 may be formed to fill the separation trenches T, respectively. The formation of the device isolation patterns 150 may include forming an insulating layer to fill the separation trenches T and planarizing the insulating layer. The device isolation patterns 150 may be formed of or include at least one of, e.g., silicon oxide, silicon nitride, or silicon oxynitride.

Figure 17:
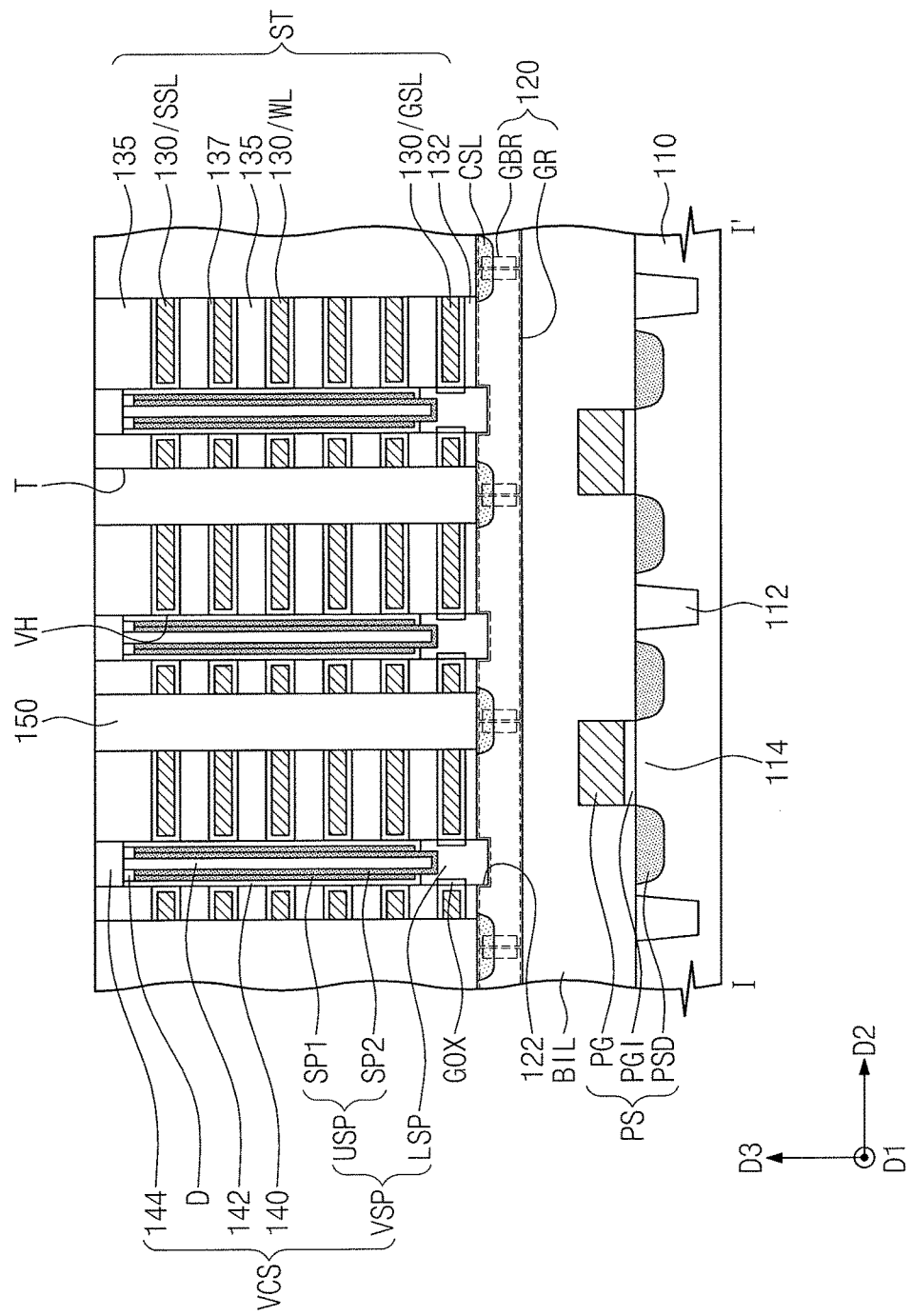

Referring to FIGS. 3A and 17, the upper semiconductor pattern USP, the data storing structure 140, and the insulating gap-fill layer 142 may be partially etched to form recessed regions. The conductive pads 144 may be formed in the recessed regions, respectively, and may serve as the drain regions D. The conductive pads 144 may be formed of or include at least one of doped poly silicon or metallic materials. Alternatively, the drain region D may be formed by doping a top portion of the upper semiconductor pattern USP with impurities. In some embodiments, the lower semiconductor pattern LSP, the upper semiconductor pattern USP, the data storing structure 140, the insulating gap-fill layer 142, the conductive pad 144, and the drain region D may constitute the vertical channel structure VCS.

Referring back to FIGS. 3A and 3B, the interlayered insulating layer 160 may be formed to cover the stacks ST and the device isolation patterns 150. The formation of the interlayered insulating layer 160 may include performing a physical vapor deposition (PVD) process, a chemical vapor deposition (CVD) process, or an atomic layer deposition (ALD) process. The interlayered insulating layer 160 may be formed of or include at least one of, e.g., silicon oxide, silicon nitride, or silicon oxynitride.

The contact plugs 170 may be formed to pass through the interlayered insulating layer 160 and to be electrically connected to the vertical channel structures VCS. The bit line BL may be formed on the interlayered insulating layer 160 to cross the stacks ST. The formation of the bit line may include forming a conductive layer on the interlayered insulating layer 160 and pattering the conductive layer.

Figure 19:
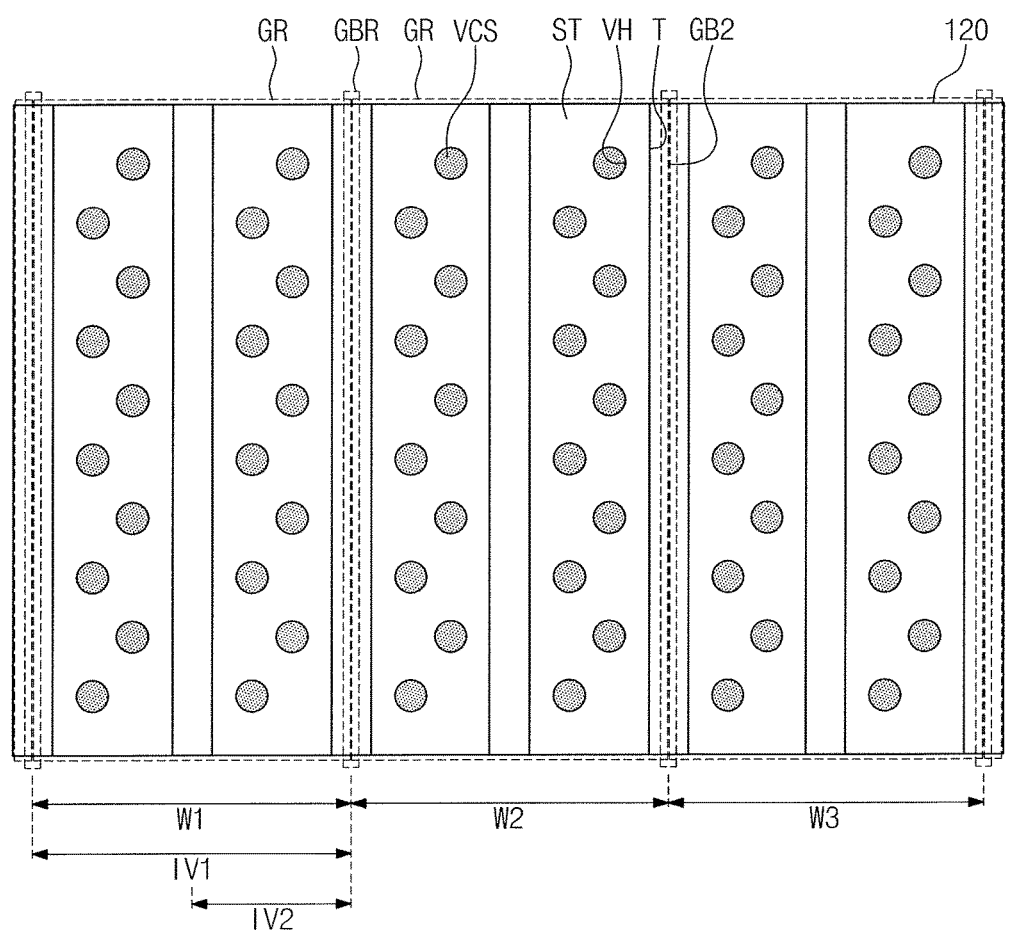
FIGS. 19 and 20 illustrate plan views of a semiconductor device according to example embodiments.
Figure 20:
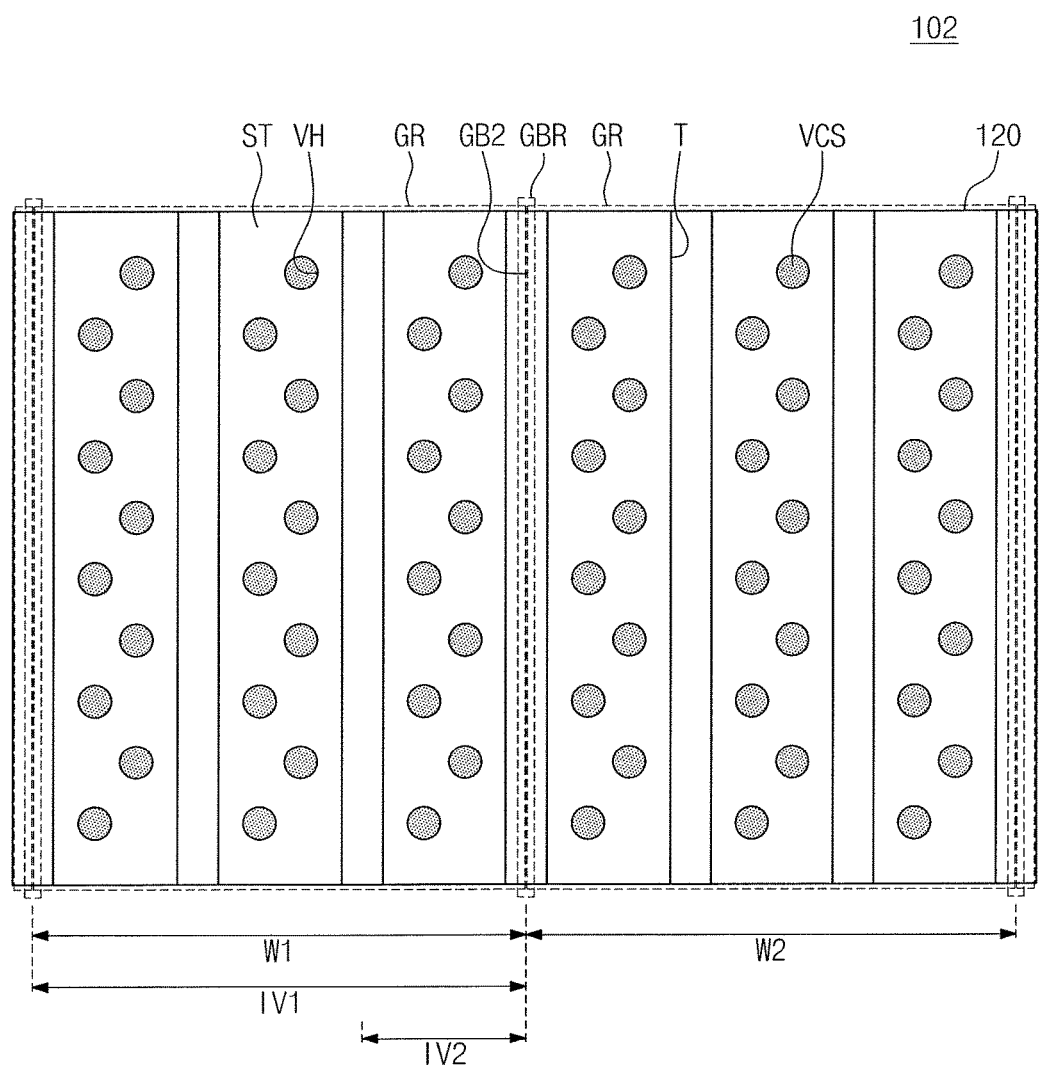

FIGS. 19 and 20 are plan views illustrating semiconductor devices according to example embodiments. Hereinafter, semiconductor devices according to example embodiments will be described with reference to FIGS. 19 and 20. For concise description, an element previously described with reference to FIGS. 3A, 3B, and 3C may be identified by a similar or identical reference number without repeating an overlapping description thereof.

Referring to FIGS. 19 and 20, a semiconductor device 101 or 102 may include the substrate, the peripheral circuit structure, the polycrystalline semiconductor layer 120, the stacks ST, the vertical channel structure VCS, and the bit line. The substrate, the peripheral circuit structure, the stacks ST, the vertical channel structure VCS, and the bit line may be provided to have substantially the same features as those described with reference to FIGS. 3A, 3B, and 3C, and the polycrystalline semiconductor layer 120 will be mainly described, without repeating an overlapping description thereof.

The polycrystalline semiconductor layer 120 may be provided on a lower insulating layer. The polycrystalline semiconductor layer 120 may include a plurality of the grain regions GR.

Each of the grain regions GR may include crystal grains, which are formed to have a longitudinal axis crossing (e.g., perpendicular to) the first direction D1 or substantially parallel to the second direction D2. The second direction D2 may cross (e.g., be perpendicular to) the first direction D1. For example, a mean length in the second direction D2 of the crystal grains may be longer than about two times a mean length in the first direction D1 of the crystal grains. Each of the grain regions GR may extend in the first direction D1. The grain regions GR may be in contact with each other in the second direction D2. As an example, the grain regions GR may be in contact with each other in the second direction D2 and may be arranged along the second direction D2. Each of the grain regions GR may have a uniform width (e.g., one of W1 to W3), when measured in the second direction D2. In addition, the widths (e.g., W1 to W3) in the second direction D2 of the grain regions GR may be substantially equal to each other.

The polycrystalline semiconductor layer 120 may include a plurality of the grain boundaries GB defined by the plurality of the crystal grains. The grain boundaries GB may include first grain boundaries and the second grain boundaries GB2. The first grain boundaries may be formed between adjacent crystal grains, which are included in each grain region GR. The second grain boundaries GB2 may be formed between adjacent crystal grains, which are respectively included in each pair of the grain regions GR in contact with each other.

The polycrystalline semiconductor layer 120 may further include at least one grain boundary region GBR, which is positioned between each pair of the grain regions GR, and in which the second grain boundaries GB2 are provided. In other words, a boundary between an adjacent pair of the grain regions GR may be positioned in the grain boundary region GBR. Since the plurality of the grain regions GR are arranged in the second direction D2 to be in contact with each other, the polycrystalline semiconductor layer 120 may include a plurality of the grain boundary regions GBR arranged in the second direction D2. Each of the grain boundary regions GBR may have a shape elongated in the first direction D1. The grain boundary regions GBR may be arranged spaced apart from each other, by a specific interval IV1, in the second direction D2.

The stacks ST may be spaced apart from each other in the second direction D2 by separation trenches T extending in the first direction D1 and may be arranged along the second direction D2. In other words, the separation trenches T may extend substantially parallel to the first direction D1 and may be spaced apart from each other, by a specific interval IV2, in the second direction D2, and thus, the stacks ST may be spaced apart from each other, by the separation trenches T interposed therebetween, in the second direction D2.

The separation trenches T may be formed to expose the grain boundary regions GBR. For example, the interval IV1 in the second direction D2 of the grain boundary regions GBR may be equal to two times or three times the interval IV2 in the second direction D2 of the separation trenches T, as shown in FIG. 19 or 20. As an example, the grain boundary regions GBR may be respectively exposed by even- or odd-numbered ones of the separation trenches T arranged in the second direction D2, as shown in FIG. 19. As another example, the grain boundary regions GBR may be respectively exposed by (3n-2)-th ones of the separation trenches T arranged in the second direction D2, as shown in FIG. 20, where n is an integer.

When viewed in a plan view, the grain boundary regions GBR may be spaced apart from the vertical channel structure VCS. In some example embodiments, when viewed in a plan view, the grain boundary regions GBR may also be spaced apart from the stacks ST.

According to example embodiments, a polycrystalline semiconductor layer may include a plurality of crystal grains arranged in a substantially regular manner. The polycrystalline semiconductor layer may be formed to have a top surface, in which a specific crystalline structure (e.g., a (110) plane) prevails over the others. In addition, when viewed in a plan view, vertical holes and lower semiconductor patterns may be spaced apart from grain boundary regions with an irregular crystal or lattice structure. Accordingly, according to example embodiments, it is possible to form the lower semiconductor pattern with good lattice characteristics (e.g., good uniformity and a low defect density), even when the lower semiconductor pattern is formed on a polycrystalline semiconductor layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a polycrystalline semiconductor layer on a substrate;
first and second stacks on the polycrystalline semiconductor layer, each of the first and second stacks extending in a first direction;
a separation trench between the first and second stacks and extending in the first direction, the separation trench separating the first and second stacks in a second direction crossing the first direction; and
vertical channel structures vertically passing through each of the first and second stacks,
wherein the polycrystalline semiconductor layer includes a first grain region and a second grain region in contact with each other, the first and second grain region being adjacent to each other along the second direction, and
wherein each of the first and second grain regions includes a plurality of crystal grains, each crystal grain having a longitudinal axis parallel to the second direction.

2. The semiconductor device as claimed in claim 1, wherein the polycrystalline semiconductor layer includes a grain boundary region extending in the first direction and having grain boundaries, each of the grain boundaries being defined by adjacent first and second crystal grains respectively included in the first and second grain regions.

3. The semiconductor device as claimed in claim 2, wherein, when viewed in a plan view, the grain boundary region overlaps the separation trench.

4. The semiconductor device as claimed in claim 2, wherein, when viewed in a plan view, the grain boundary region is spaced apart from the vertical channel structures.

5. The semiconductor device as claimed in claim 2, wherein:
the polycrystalline semiconductor layer further comprises a common source region extending in the first direction, and
when viewed in a plan view, the grain boundary region and the common source region overlap each other.

6. The semiconductor device as claimed in claim 1, wherein a mean length of each crystal grain in the second direction is longer than two times a mean length of the crystal grain in the first direction.

7. The semiconductor device as claimed in claim 1, wherein each of the first and second grain regions extends in the first direction.

8. The semiconductor device as claimed in claim 1, wherein the polycrystalline semiconductor layer has a (110) plane in 90% or more of a total area of a top surface thereof.

9. The semiconductor device as claimed in claim 1, wherein each of the vertical channel structures includes a pillar-shaped lower semiconductor pattern in contact with the polycrystalline semiconductor layer.

10. The semiconductor device as claimed in claim 1, further comprising a peripheral circuit structure between the substrate and the polycrystalline semiconductor layer.

11. A semiconductor device, comprising:
a polycrystalline semiconductor layer on a substrate;
a plurality of stacks on the polycrystalline semiconductor layer, each of the plurality of stacks extending in a first direction;
separation trenches between the stacks adjacent to each other along a second direction, each of the separation trenches extending in the first direction, and the second direction crossing the first direction;
vertical channel structures vertically passing through the stacks,
wherein the polycrystalline semiconductor layer includes:
a plurality of grain regions adjacent to each other in the second direction, each of the grain regions including crystal grains with longitudinal axes parallel to the second direction, and
grain boundary regions including grain boundaries, each of the grain boundaries being defined by adjacent ones of the crystal grains respectively included in an adjacent pair of the grain regions.

12. The semiconductor device as claimed in claim 11, wherein, when viewed in a plan view, each of the grain boundary regions overlaps a respective one of the separation trenches.

13. The semiconductor device as claimed in claim 11, wherein the grain boundary regions are arranged in the second direction.

14. The semiconductor device as claimed in claim 13, wherein, when measured in the second direction, an interval between the grain boundary regions is substantially equal to an integer times an interval between the separation trenches.

15. The semiconductor device as claimed in claim 11, wherein, when viewed in a plan view, each of the vertical channel structures is spaced apart from the grain boundary regions.

16. A semiconductor device, comprising:
a polycrystalline semiconductor layer on a substrate, longitudinal axes of crystal grains in the polycrystalline semiconductor layer being oriented along a same direction;
first and second stacks on the polycrystalline semiconductor layer, the first and second stacks being spaced apart from each other;
a separation trench between the first and second stacks; and
vertical channel structures vertically passing through each of the first and second stacks to contact the polycrystalline semiconductor layer.

17. The semiconductor device as claimed in claim 16, wherein the longitudinal axes of the crystal grains in the polycrystalline semiconductor layer extend in a same direction as an imaginary line connecting the first and second stacks.

18. The semiconductor device as claimed in claim 16, wherein the polycrystalline semiconductor layer includes a first grain region and a second grain region overlapping the first and second stacks, respectively, a contact region between the first and second grain regions defining a grain boundary region exposed through the separation trench.

19. The semiconductor device as claimed in claim 18, wherein each of the vertical channel structures includes a vertical semiconductor pattern in direct contact with the polycrystalline semiconductor layer, the vertical semiconductor pattern being completely separated from the grain boundary region.

20. The semiconductor device as claimed in claim 16, wherein each of the vertical channel structures includes a vertical semiconductor pattern in direct contact with the polycrystalline semiconductor layer, a bottom of the vertical semiconductor pattern directly contacting only a region of the polycrystalline semiconductor layer including regularly arranged crystal grains.

\* \* \* \* \*